(12) United States Patent
Ching et al.

(10) Patent No.: US 9,209,303 B2
(45) Date of Patent: Dec. 8, 2015

(54) STRUCTURE AND METHOD FOR FINFET DEVICE

(71) Applicant: Taiwan Semiconductor Manufacturing Company, Ltd., Hsin-Chu (TW)

(72) Inventors: Kuo-Cheng Ching, Hsinchu County (TW); Ka-Hing Fung, Hsinchu County (TW); Chih-Sheng Chang, Hsinchu (TW); Zhiqiang Wu, Hsinchu County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/290,625

(22) Filed: May 29, 2014

(65) Prior Publication Data
US 2015/0311335 A1 Oct. 29, 2015

Related U.S. Application Data

(60) Provisional application No. 61/983,770, filed on Apr. 24, 2014.

(51) Int. Cl.
| | |
|---|---|
| *H01L 21/00* | (2006.01) |
| *H01L 29/78* | (2006.01) |
| *H01L 29/66* | (2006.01) |
| *H01L 29/165* | (2006.01) |

(52) U.S. Cl.
CPC ............ *H01L 29/785* (2013.01); *H01L 29/165* (2013.01); *H01L 29/66795* (2013.01)

(58) Field of Classification Search
CPC ............ H01L 29/785; H01L 29/66795; H01L 29/165
See application file for complete search history.

(56) References Cited

U.S. PATENT DOCUMENTS

| | | | |
|---|---|---|---|
| 6,359,311 B1 | 3/2002 | Colinge et al. | |
| 6,855,582 B1* | 2/2005 | Dakshina-Murthy et al. | 438/157 |
| 6,864,164 B1* | 3/2005 | Dakshina-Murthy et al. | 438/585 |
| 7,719,043 B2* | 5/2010 | Yamagami et al. | 257/308 |

OTHER PUBLICATIONS

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008, pp. 054909-1 through 054909-5, American Institute of Physics.
F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.
(Continued)

*Primary Examiner* — Richard Booth
(74) *Attorney, Agent, or Firm* — Haynes and Boone, LLP

(57) ABSTRACT

The present disclosure provides a fin-like field-effect transistor (FinFET) device. The device includes a substrate having a first region, a second region and a third region. The first region includes a first fin structure, a first high-k (HK)/metal gate (MG) stack wrapping over an upper portion of the first fin structure and a first source/drain features, separated by the first HK/MG stack, over the recessed first fin structure. The second region includes a second fin structure, the first source/drain features over a portion of the recessed second fin structure. The third region includes a dummy gate stack over the second fin structure and the two first regions are separated by the second region, or by the third region.

20 Claims, 24 Drawing Sheets

(56) References Cited

OTHER PUBLICATIONS

Tetlin et al., "Kinetics and Mechanism of Low Temperature Atomic Oxygen-Assisted Oxidation of SiGe Layers," Journal of Applied Physics, Mar. 1, 1998, pp. 2842-2846, vol. 83, No. 5, American Institute of Physics.

P. Gas et al., "Diffusion of Sb, Ga, Ge, and (AS) in TiSi2," Journal of Applied Physics, Jun. 1, 1988, pp. 5335-5345, vol. 63, No. 11, American Institute of Physics.

U.S. Appl. No. 13/934,992, filed Jul. 3, 2013, by inventors Kuo-Cheng Ching, Chih-Hao Wang, Zhiciiang Wu and Carlos H. Diaz for "Fin Structure of Semiconductor Device," 21 pages of text, 12 pages of drawings.

U.S. Appl. No. 13/740,373, filed Jan. 14, 2013, by inventors Chih-Hao Wang, Kuo-Cheng Ching, Gwan Sin Chang, and Zhicliang Wu for "Semiconductor Device and Fabricating the Same," 21 pages of text, 17 pages of drawings.

U.S. Appl. No. 13/902,322, filed May 24, 2013, by inventors Chih-Hao Wang, Kuo-Cheng Ching, Gwan Sin Chang, and Zhiciiang Wu for "FinFET Device and Method of Fabricating Same," 20 pages of text, 15 pages of drawings.

U.S. Appl. No. 14/155,793, filed Jan. 15, 2014, by inventors Kuo-Cheng Ching, Chih-Hao Wang, Zhicliang Wu and Carlos H. Diaz for "Semiconductor Device and Formation Thereof," 16 pages of text, 12 pages of drawings.

U.S. Appl. No. 14/254,035, filed Apr. 16, 2014, by inventors Kuo-Cheng Ching, Ka-Hing Fung, Chih-Sheng Chang and Zhiciiang Wu for "FinFET Device with High-K Metal Gate Stack," 22 pages of text, 14 pages of drawings.

U.S. Appl. No. 14/254,072, filed Apr. 16, 2014, by inventors Kuo-Cheng Ching, Ka-Hing Fung, Chih-Sheng Chang and Zhiciiang Wu for "A Method and Structure for FinFET Device," 26 pages of text, 14 pages of drawings.

\* cited by examiner

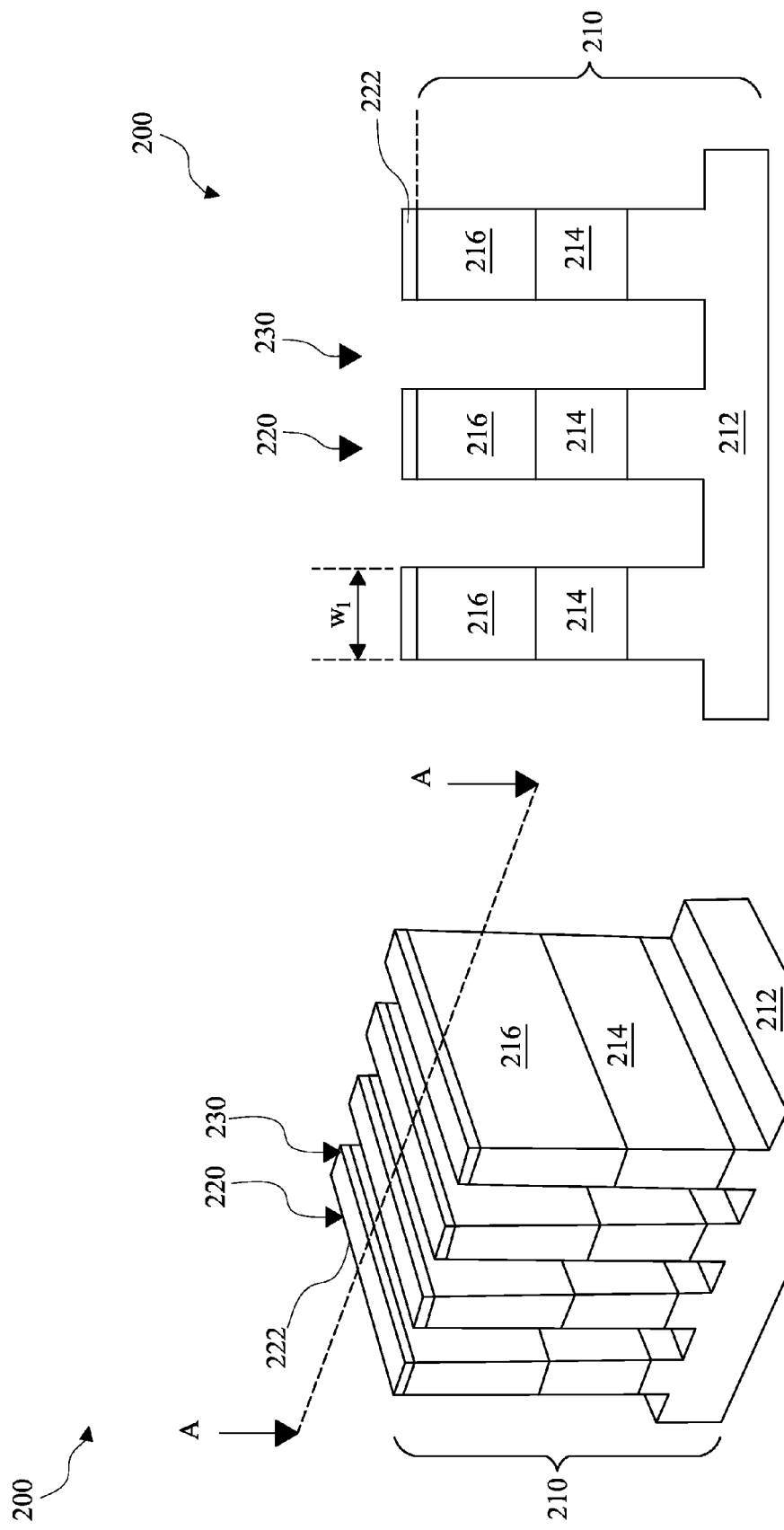

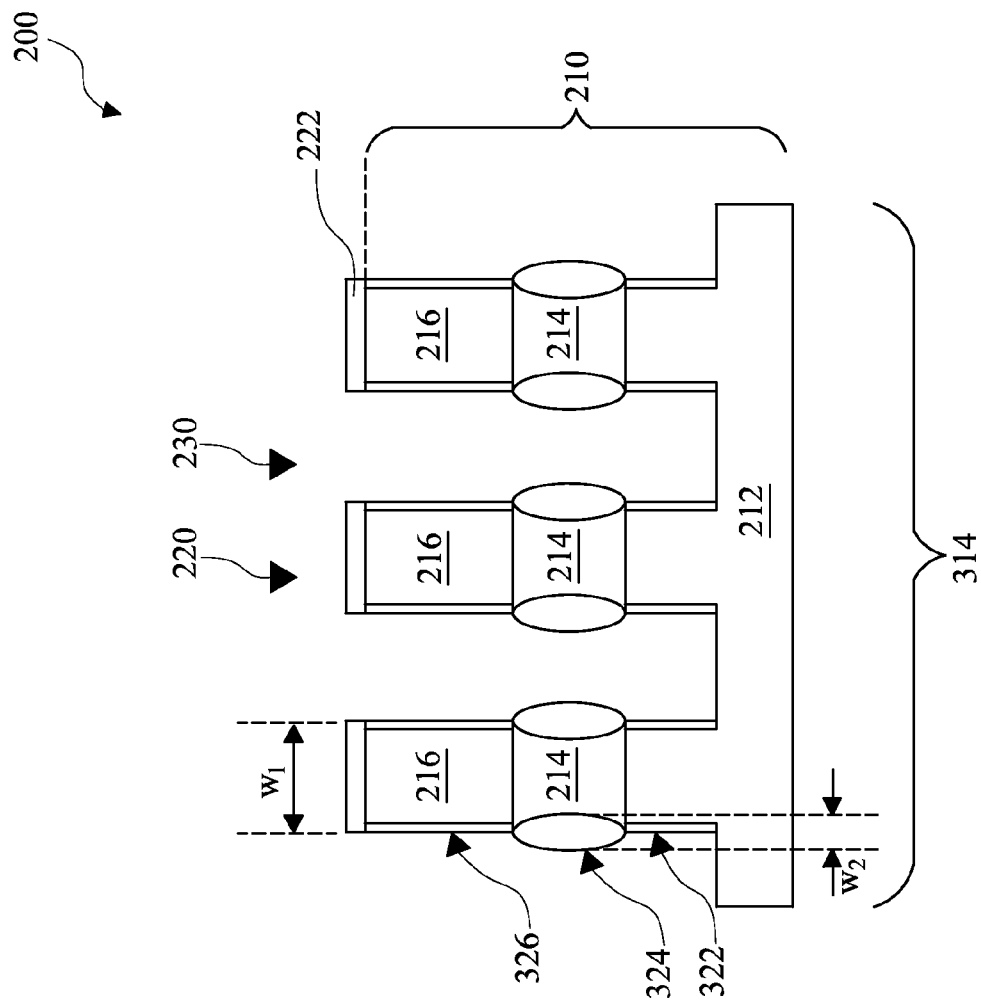

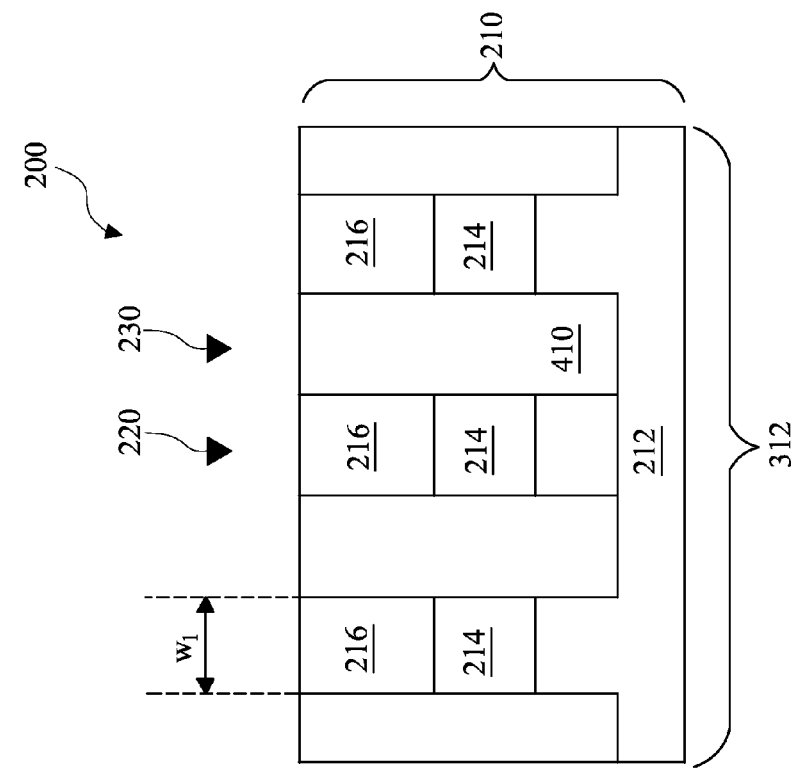
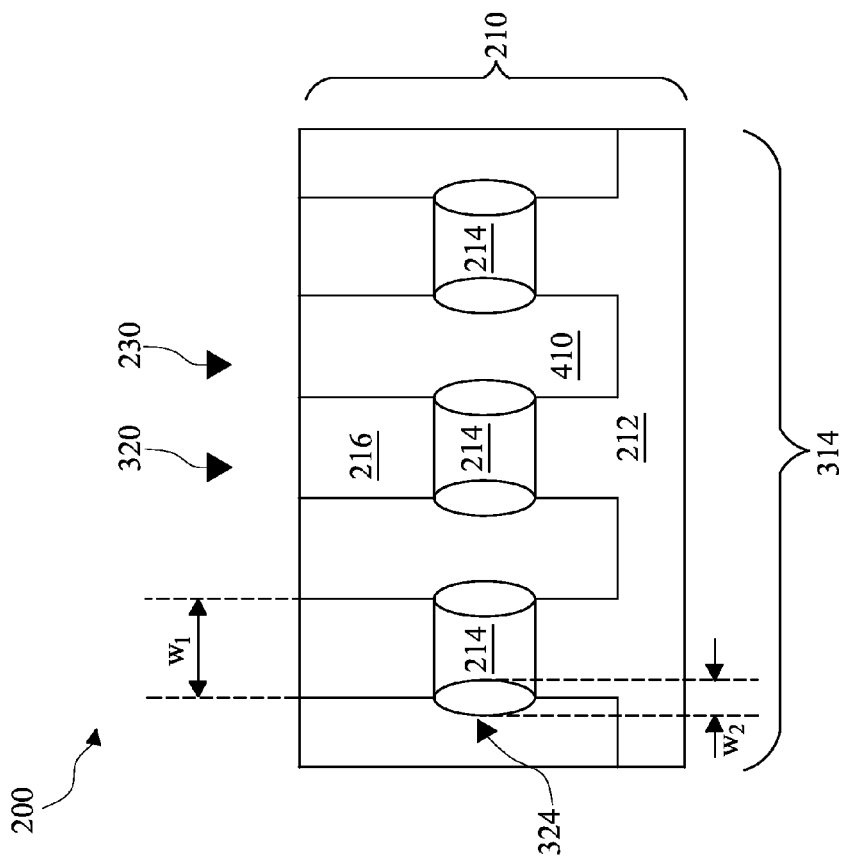
FIG. 6A
FIG. 6B

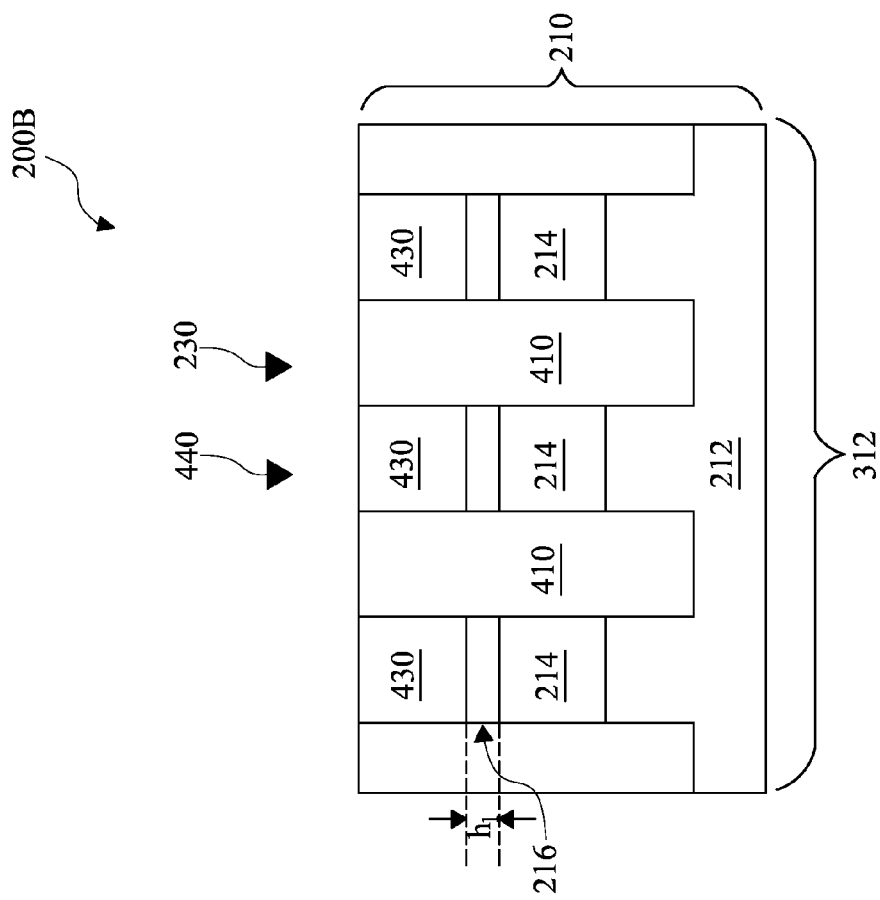
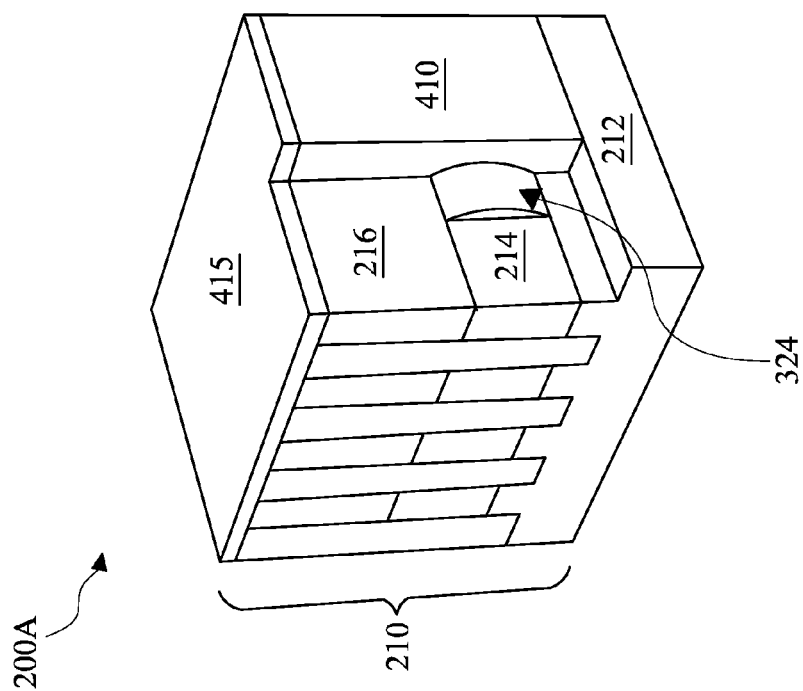
FIG. 7B
FIG. 7A

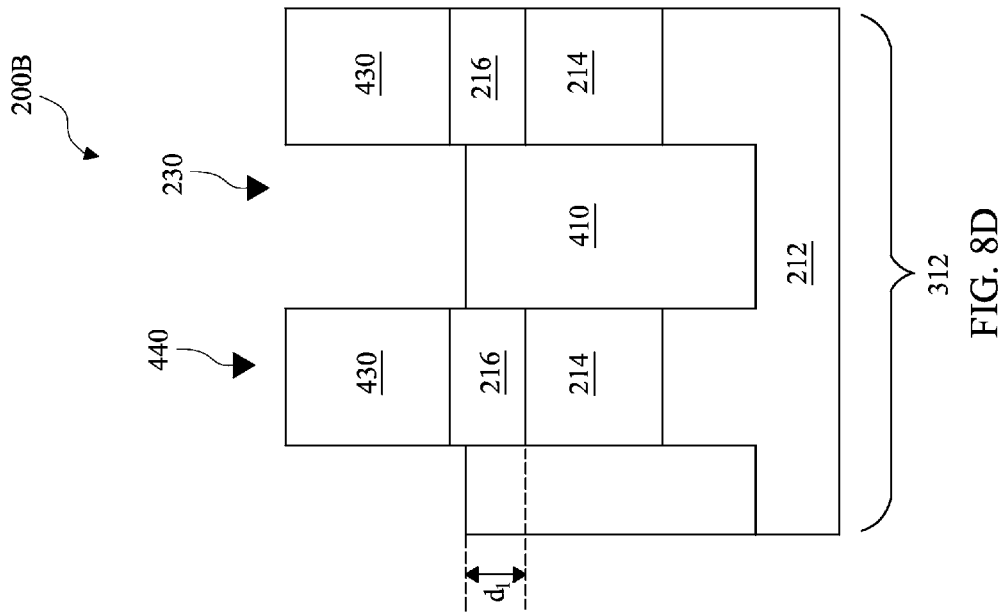
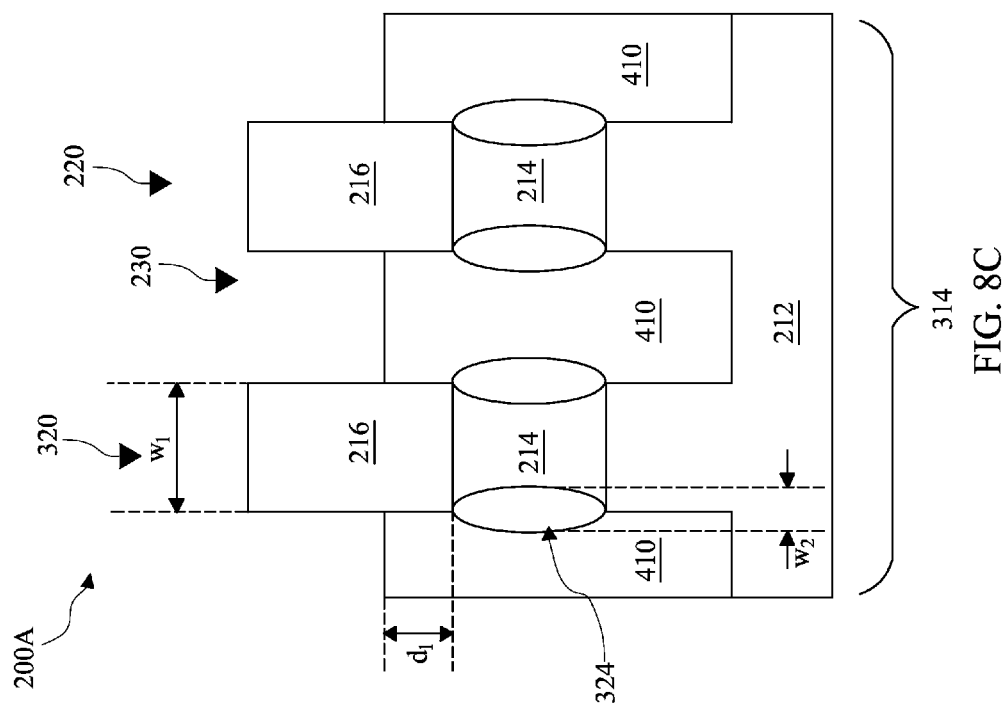
FIG. 8C
FIG. 8D

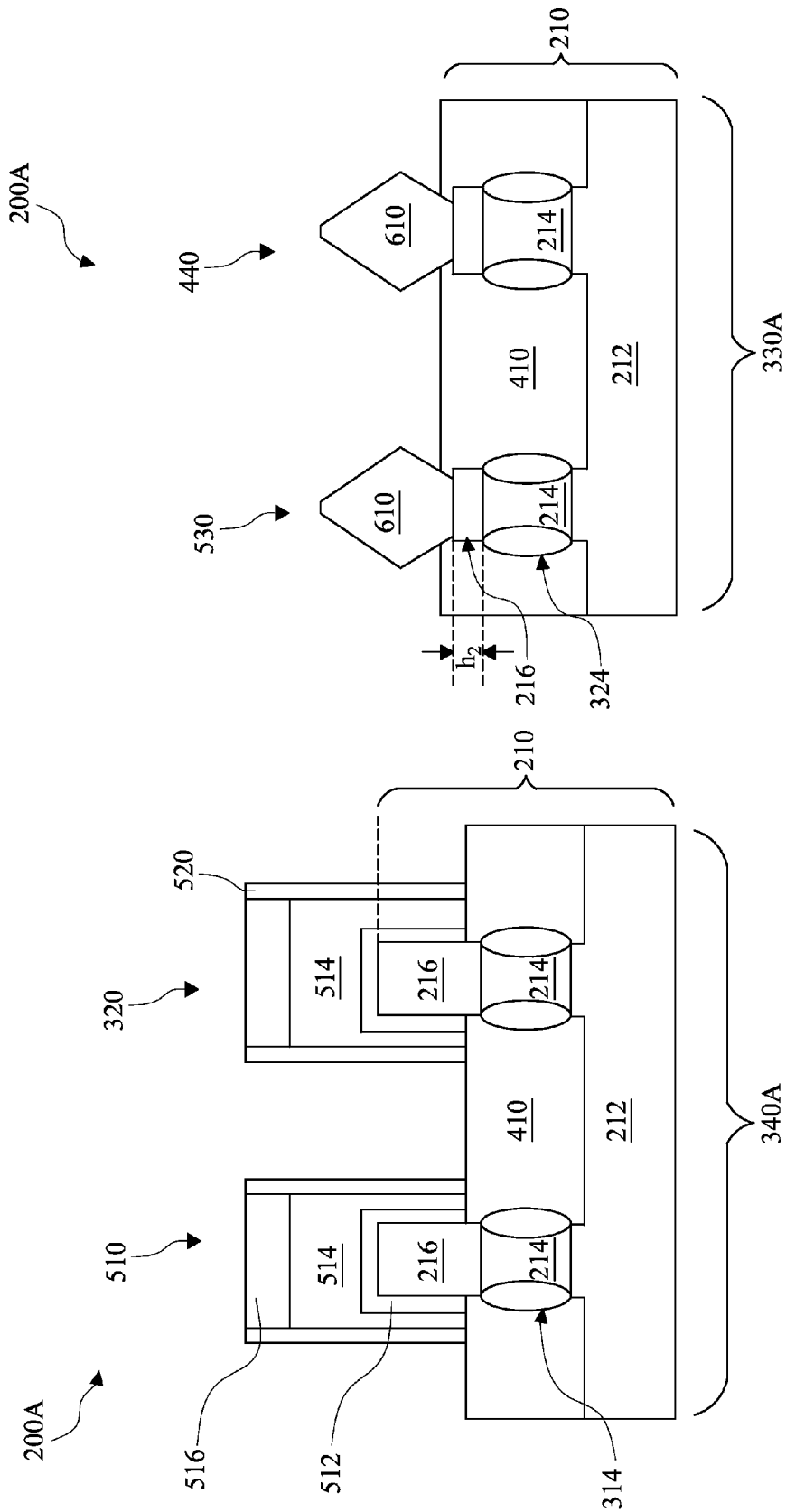

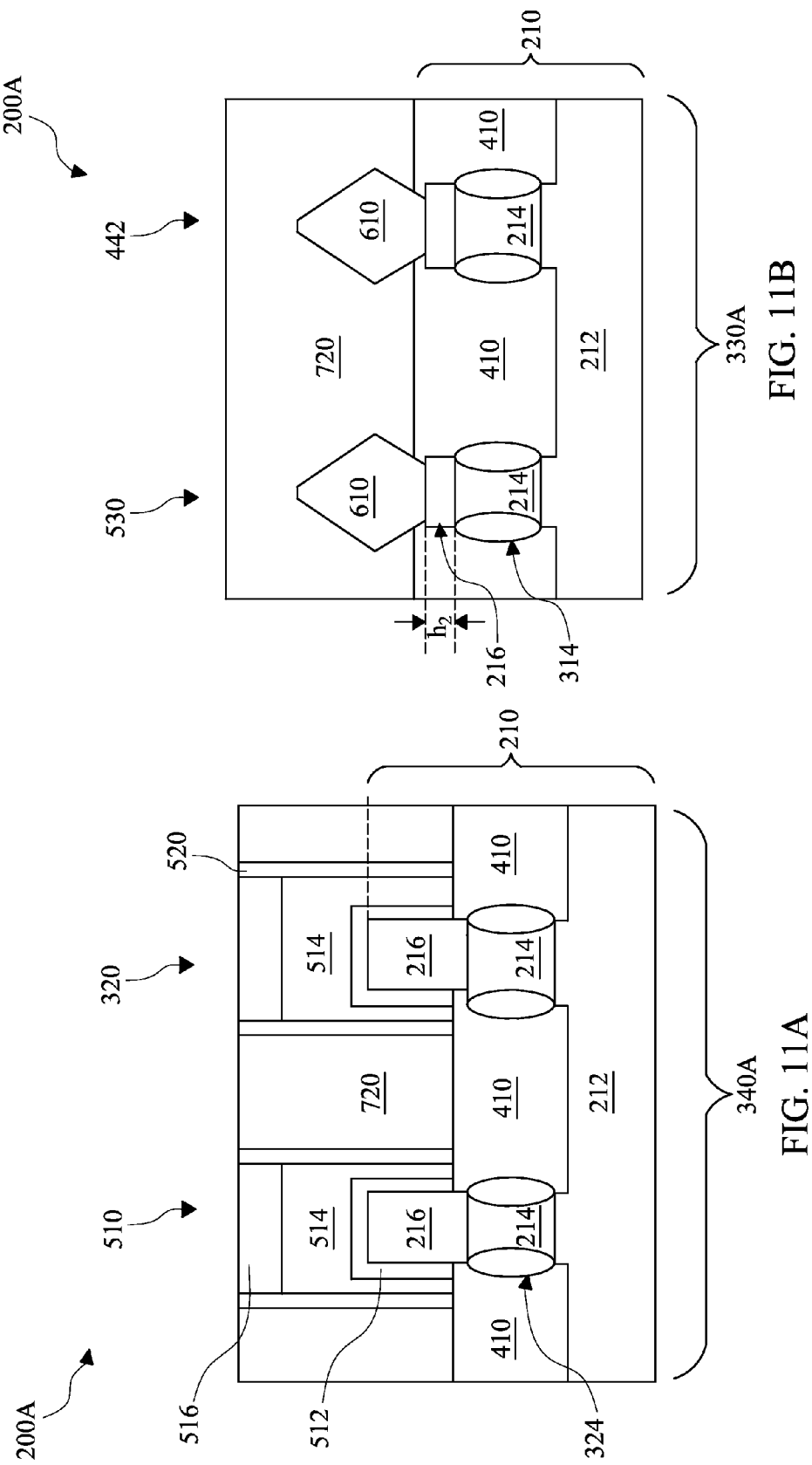

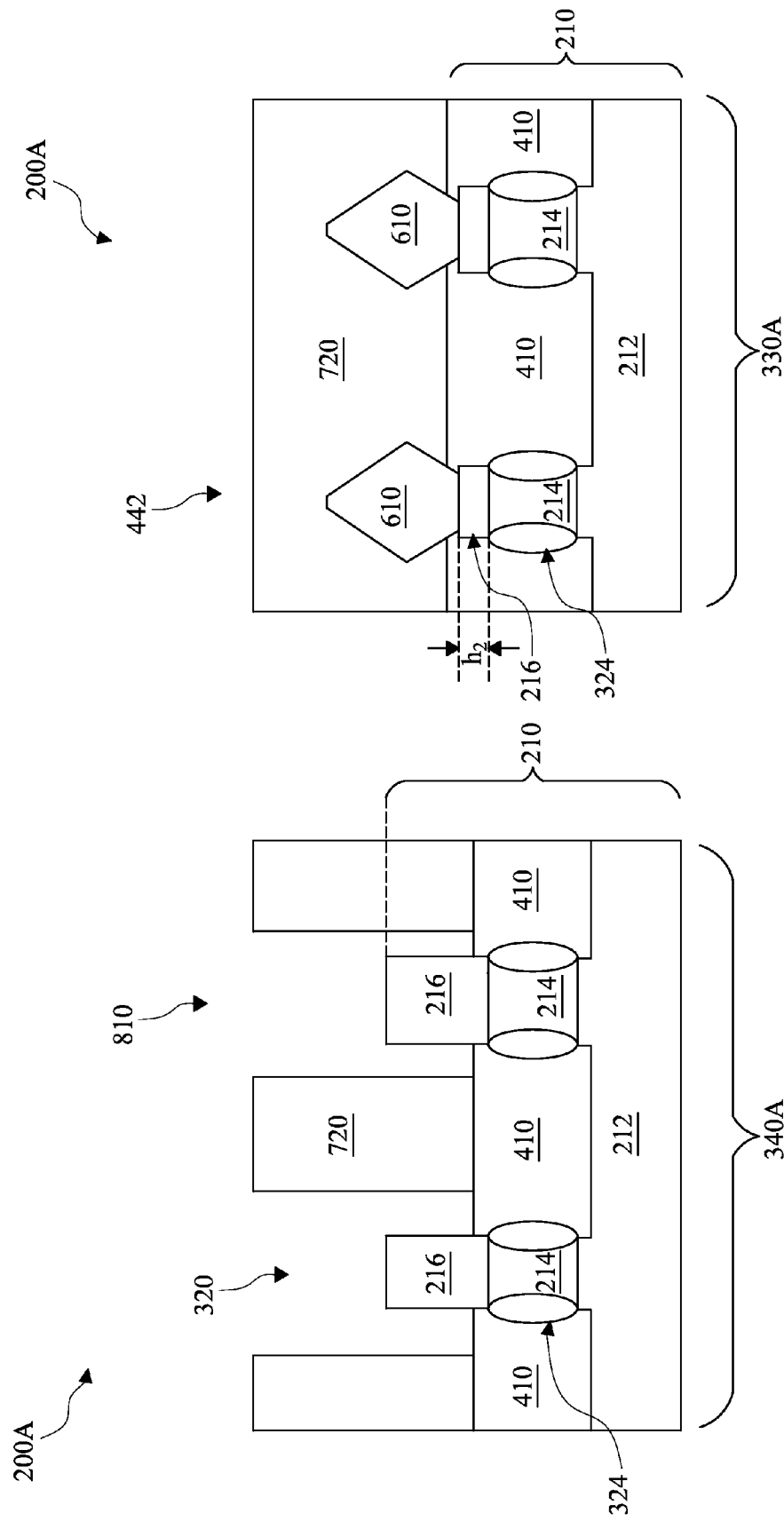

STRUCTURE AND METHOD FOR FINFET DEVICE

CROSS-REFERENCE

This application claims priority to U.S. Provisional Patent Application Ser. No. 61/983,770, filed on Apr. 24, 2014, the entire disclosure of which is hereby incorporated herein by reference.

This application is related to patent applications U.S. Ser. No. 13/740,373 filed on Jan. 14, 2013, as "Semiconductor Device and Fabricating the Same;" U.S. Ser. No. 13/902,322 filed on May 24, 2013, as "FinFET Device and Method of Fabricating Same;" U.S. Ser. No. 13/934,992 filed on Jul. 3, 2013, as "Fin Structure of Semiconductor Device;" and U.S. Ser. No. 14/155,793 filed on Jan. 15, 2014, as "Semiconductor Device and Formation Thereof," the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIG. 3A is a diagrammatic perspective view of an example FinFET device undergoing processes in accordance with some embodiments FIG. 3B is a cross-sectional view of an example FinFET device alone the line A-A in FIG. 3A at fabrication stages constructed according to the method of FIG. 1.

FIG. 5 is a cross-sectional view of an example FinFET device along the line A-A in FIG. 4 at fabrication stages constructed according to the method of FIG. 1.

FIG. 6A is a cross-sectional view of an example FinFET device along the line A-A in FIG. 4 at fabrication stages constructed according to the method of FIG. 1.

FIG. 6B is a cross-sectional view of an example FinFET device along the line AA-AA in FIG. 4 at fabrication stages constructed according to the method of FIG. 1.

FIG. 7A is a diagrammatic perspective view of an example FinFET device undergoing processes in accordance with some embodiments.

FIG. 7B is a cross-sectional view of an example FinFET device along the line AA-AA in FIG. 4 at fabrication stages constructed according to the method of FIG. 1.

FIG. 8C is a cross-sectional view of an example FinFET device along the line A-A in FIG. 8A at fabrication stages constructed according to the method of FIG. 1.

FIG. 8D is a cross-sectional view of an example FinFET device along the line B-B in FIG. 8B at fabrication stages constructed according to the method of FIG. 1.

FIG. 10B is a cross-sectional view of an example FinFET device along the line A-A in FIG. 10A at fabrication stages constructed according to the method of FIG. 1.

FIGS. 10C and 10D are cross-sectional views of an example FinFET device along the line AA-AA in FIG. 10A at fabrication stages constructed according to the method of FIG. 1.

FIG. 11A is a cross-sectional view of an example FinFET device along the line A-A in FIG. 10A at fabrication stages constructed according to the method of FIG. 1.

FIGS. 11B and 11C are cross-sectional views of an example FinFET device along the line AA-AA in FIG. 10A at fabrication stages constructed according to the method of FIG. 1.

FIG. 12B is a cross-sectional view of an example FinFET device along the line A-A in FIG. 11A at fabrication stages constructed according to the method of FIG. 1.

FIG. 12C is a cross-sectional view of an example FinFET device along the line AA-AA in FIG. 12A at fabrication stages constructed according to the method of FIG. 1.

DETAILED DESCRIPTION

Figure 1:
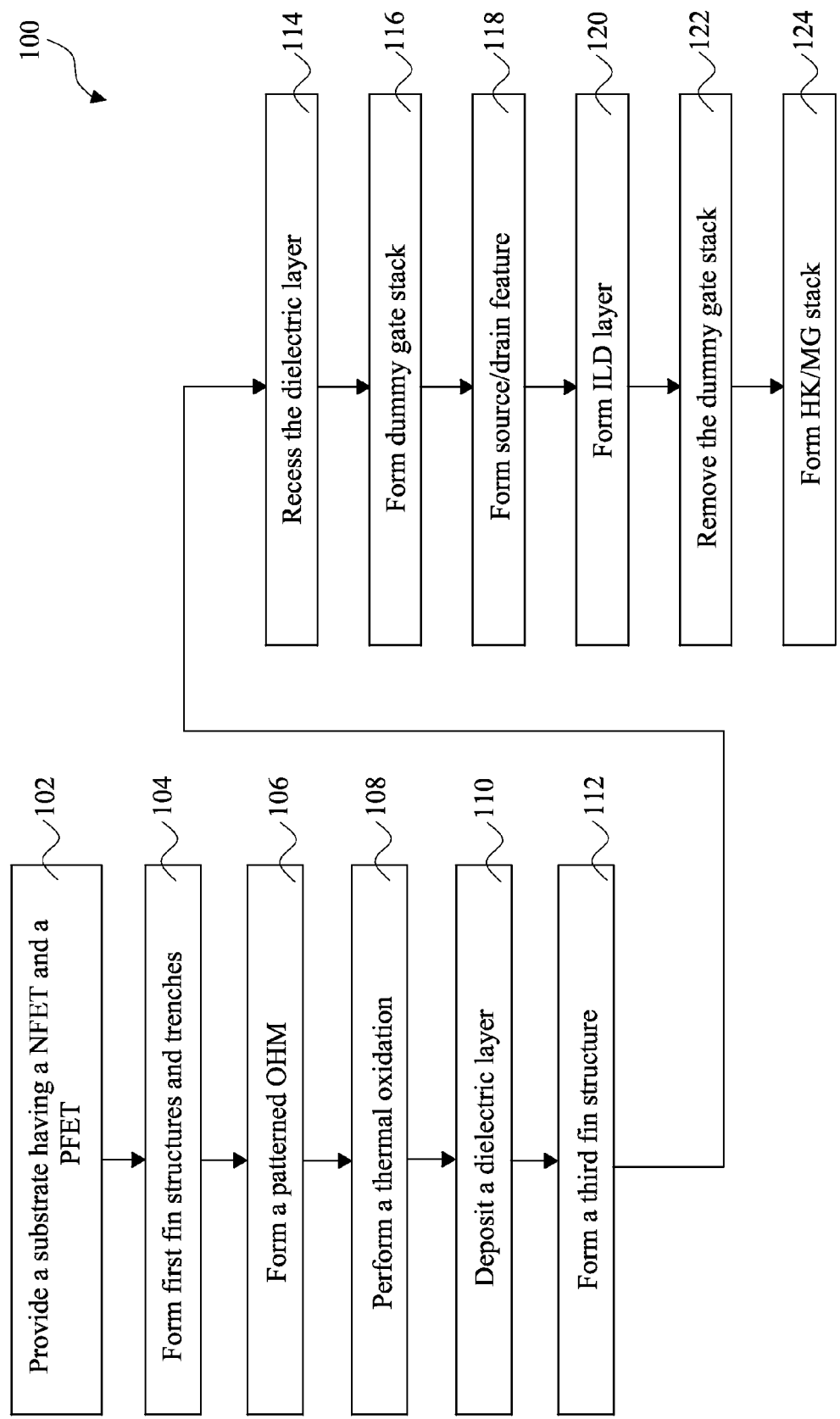
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 in accordance with some embodiments. It is understood that additional steps may be implemented before, during, and after the method, and some of the steps described may be replaced or eliminated for other embodiments of the method. The FinFET device 200 and the method 100 making the same are collectively described with reference to various figures.

Figure 2B:
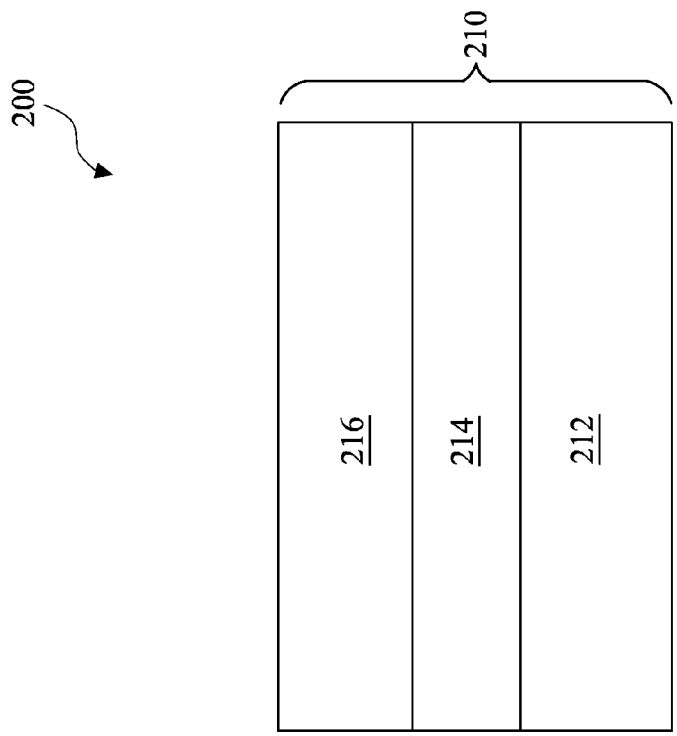
FIG. 2B is a cross-sectional view of an example FinFET device along the line A-A in FIG. 2A at fabrication stages constructed according to the method of FIG. 1.
Figure 2A:
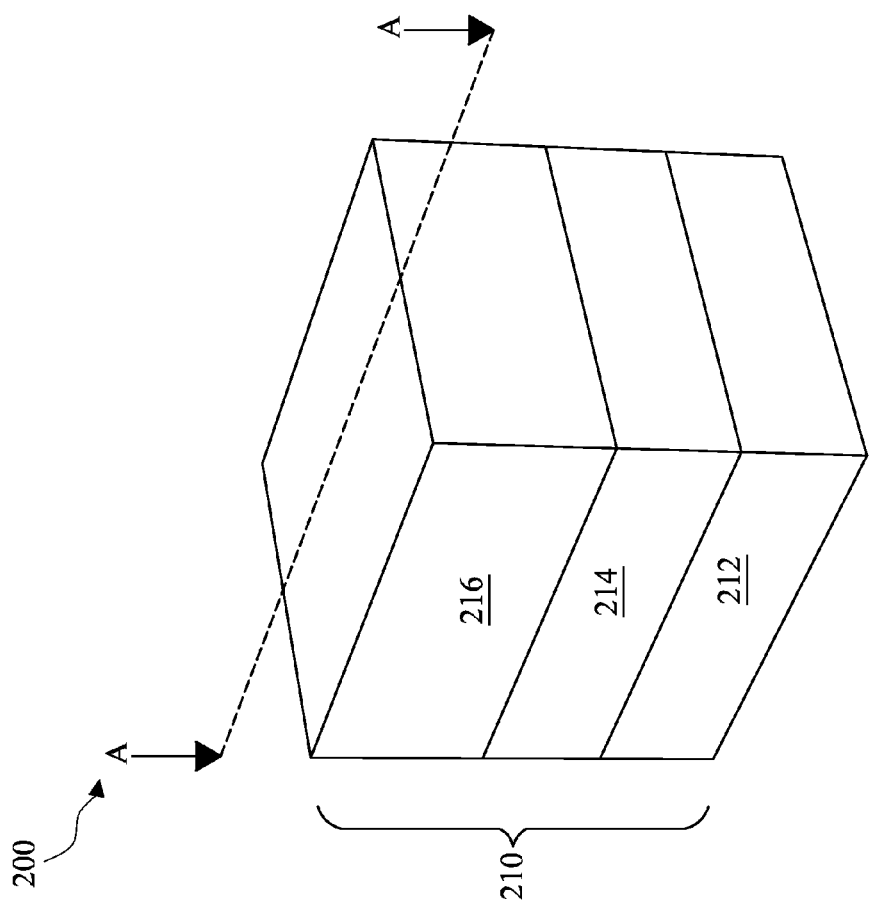
FIG. 2A is a diagrammatic perspective view of an example FinFET device undergoing processes in accordance with some embodiments.

Referring to FIGS. 1 and 2A-2B, the method 100 begins at step 102 by providing a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

In the present embodiment, the substrate 210 includes a first semiconductor material layer 212, a second semiconductor material layer 214 disposed over the first semiconductor material layer 212 and a third semiconductor material layer 216 disposed over the second semiconductor material layer 214. The second and third semiconductor material layers, 214 and 216, are different from each other. The second semiconductor material layer 214 has a first lattice constant and the third semiconductor material layer 416 has a second lattice constant different from the first lattice constant. In the present embodiment, the second semiconductor material layer 214 includes silicon germanium (SiGe), and both of the first and the third semiconductor material layers, 212 and 216, include silicon. In various examples, the first, the second and the third semiconductor material layers, 212, 214 and 216, may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the second and the third semiconductor material layers, 214 and 216, are deposited by epitaxial growth, referred to as a blanket channel epi. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

The substrate 210 may include various doped features depending on design requirements as known in the art. In some embodiment, the substrate 210 may include various doped regions depending on design requirements (e.g., p-type substrate or n-type substrate). In some embodiment, the doped regions may be doped with p-type or n-type dopants. For example, the doped regions may be doped with p-type dopants, such as boron or $BF_2$; n-type dopants, such as phosphorus or arsenic; and/or combination thereof. The doped regions may be configured for an n-type FinFET (NFET), or alternatively configured for a p-type FinFET (PFET).

Referring to FIGS. 1 and 3A-3B, the method 100 proceeds to step 104 by forming first fins 220 and trenches 230 in the substrate 210. The first fin 220 has a first width $w_1$. In one embodiment, a patterned fin hard mask (FHM) layer 222 is formed over the substrate 210. The patterned FHM layer 222 includes silicon oxide, silicon nitride, silicon oxynitride, or any other suitable dielectric material. The patterned hard mask layer 222 may include a single material layer or multiple material layers. The patterned FHM layer 222 may be formed by depositing a material layer by thermal oxidation, chemical vapor deposition (CVD), atomic layer deposition (ALD), or any other appropriate method, forming a patterned photoresist (resist) layer by a lithography process, and etching the material layer through the openings of the patterned photoresist layer to form the patterned FHM layer 222.

An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing.

The substrate 210 is then etched through the patterned FHM layer 222 to form the first fins 220 and the trenches 230 in the substrate 210. In another embodiment, the patterned photoresist layer is directly used the patterned FHM layer 222 as an etch mask of the etch process to form the first fins 220 and the trenches 230 in the substrate 210. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, the etching depth is controlled such that the third and the second semiconductor material layers, 216 and 214 are exposed but the first semiconductor material layer 212 is partially exposed in the trench 230. Thus the first fin 220 is formed to have the third semiconductor material layer 216 as an upper portion, the second semiconductor material layer 214 as a middle portion and the first semiconductor material layer 212 as a bottom portion.

Figure 4:
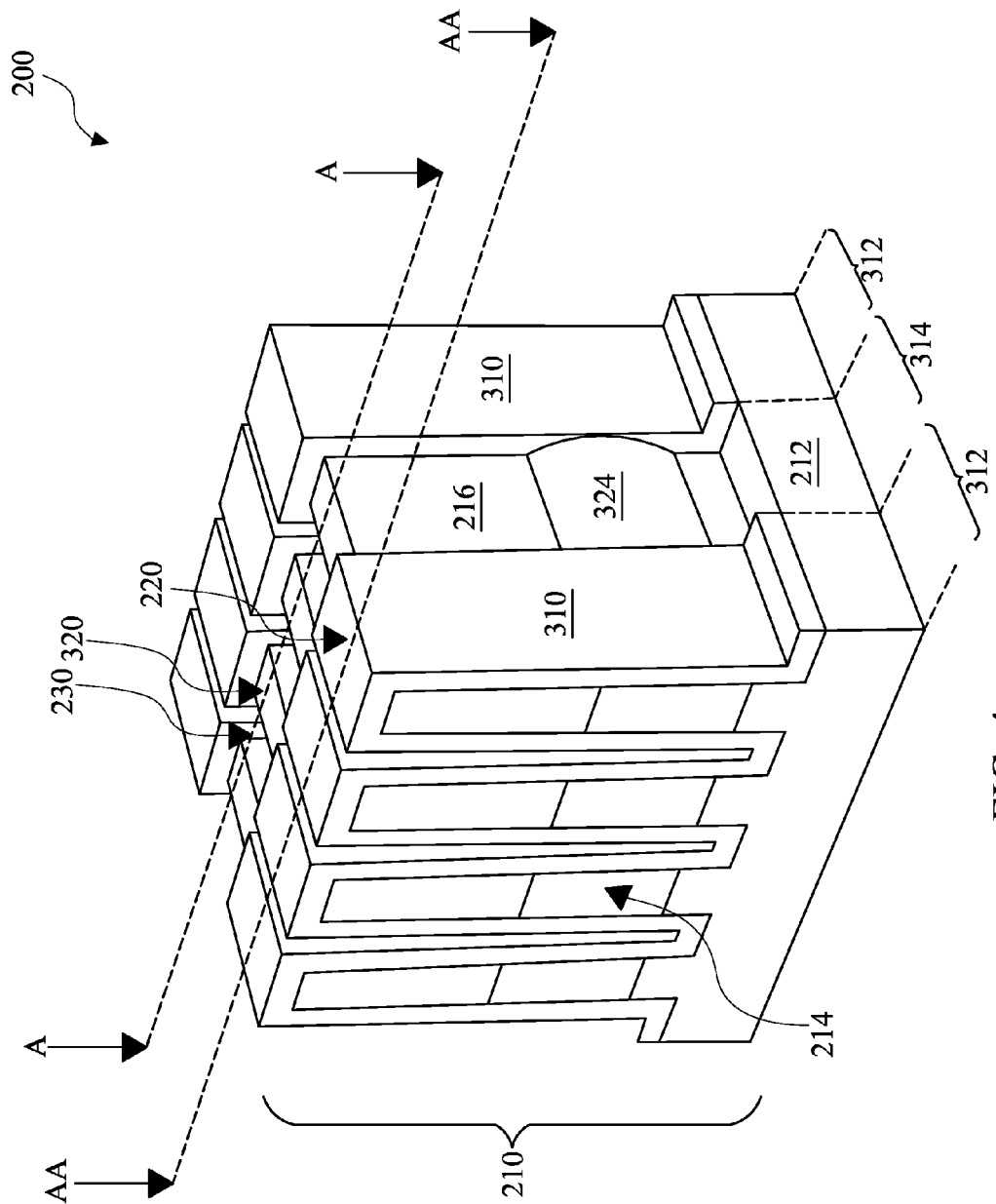
FIG. 4 is a diagrammatic perspective view of a FinFET device undergoing processes in accordance with some embodiments.

Referring to FIGS. 1 and 4, the method 100 proceeds to step 106 by forming a patterned oxidation-hard-mask (OHM) 310 over the substrate 210, including wrapping a portion of the first fins 220. In the present embodiment, the patterned OHM 310 defines a first region 312 and a second region 314, in the substrate 210. In the first region 312, the substrate 210, including the first fin 220 is covered by the patterned OHM 310. While in the second region 314, the substrate 210, including the first fin 220 is not covered by the patterned OHM 310. The patterned OHM layer 310 may include silicon oxide, silicon nitride, silicon oxynitride, or any other suitable dielectric material. The patterned OHM layer 310 may be formed by depositing a material layer by thermal oxidation, chemical CVD, ALD, or any other appropriate method, forming a patterned photoresist (resist) layer by a lithography process, and etching the material layer through the openings of the patterned photoresist layer to form the patterned OHM layer 310.

Referring to FIGS. 1, 4 and 5, the method 100 proceeds to step 108 by performing a thermal oxidation process to the FinFET device 200. In one embodiment, the thermal oxidation process is conducted in oxygen ambient. In another embodiment, the thermal oxidation process is conducted in a combination of steam ambient and oxygen ambient. In the second region 314, during the thermal oxidation process, at least outer layers of the first, the second and the third semiconductor material layers, 212, 214 and 216, convert to a first, second and a third semiconductor oxide features 322, 324 and 326, respectively. While in the first region 312, the OHM 310 prevents the substrate 210, including the first fin 220, to be oxidized. Therefore, the thermal oxidation process is referred to as a selective oxidation.

After the thermal oxidation process, the first fin 220 in the second region 324 has a different structure than those in the first region 312. For the sake of clarity to better description, the first fin 220 in the second region 214 (having the second semiconductor oxide feature 214) is referred to as a second fin 320. Thus the second fin 320 has the third semiconductor material layer 216 as its upper portion, the second semiconductor material layer 214, with the second semiconductor oxide feature 324 at its outer layer, as its middle portion and the first semiconductor material layer as its bottom portion.

In the present embodiment, the thermal oxidation process is controlled such that the second semiconductor material layer 214 oxidizes much faster that the first and third semiconductor material layers, 212 and 216. In another words, comparing to the second semiconductor oxide feature 324, the first and third semiconductor oxide features, 322 and 326, are quite thin. As an example, the thermal oxidation process to the FinFET device 200 is performed in a $H_2O$ reaction gas with a temperature ranging from about 400° C. to about 600° C. and under a pressure ranging from about 1 atm. to about 20 atm. After the oxidation process, a cleaning process is performed to remove the first and the third semiconductor oxide features, 322 and 326. The cleaning process may be performed using diluted hydrofluoric (DHF) acid.

In the present example, the second semiconductor oxide features 324 extends in the vertical direction with a horizontal dimension varying from the top surface to the bottom surface of the second semiconductor material layer 214. In furtherance of the present example, the horizontal dimension of the second semiconductor oxide features 324 reaches its maximum, referred to as a second width $w_2$, and decreases to close to zero when approaches to the top and bottom surfaces of the second semiconductor oxide features 324, resulting in an olive shape in a cross-sectional view. By tuning of the thermal oxidation process, selecting a composition and thickness of the second semiconductor material layer 214 and tuning the oxidation temperature, it achieves a target second width $w_2$ of the second semiconductor oxide feature 324, which applies an adequate stress to the third semiconductor material layer 216 in the first fin 220, where a gate channel is to be defined underlying a gate region, which will be described later.

In one embodiment, the second semiconductor material layer 214 includes silicon germanium ($SiGe_{x_1}$) and both of the first and the third semiconductor material layers, 212 and 216, include silicon (Si). The subscript $x_1$ is a first Ge composition in atomic percent and it may be adjusted to meet a predetermined volume expansion target. In one embodiment, $x_1$ is selected in a range from about 20% to about 80%. An outer layer of the $SiGe_{x_1}$ layer 214 is oxidized by the thermal oxidation process, thereby forming the silicon germanium oxide ($SiGeO_y$) feature 324, where subscript y is oxygen composition in atomic percent. The second width $w_2$ of the $SiGeO_y$ feature 324 is achieved in a range of about 10%-about 25% of the first width $w_1$. A center portion of the $SiGe_{x_1}$ layer 214 changes to a second Ge composition $x_2$, which is much higher than $x_1$. A size and shape of the center portion of $SiGe_{x_2}$ vary with process conditions, such as thermal oxidation temperature and time. Also the second Ge composition $x_2$ in the center portion is higher than other portions, such as a top portion, a bottom portion, a left side portion and a right side portion. As an example, the composition $x_2$ of Ge in the center portion is about 5% to about 30% higher than other portions.

Referring to FIGS. 1 and 6A-6B, the method 100 proceeds to step 110 by depositing a dielectric layer 410 over the substrate 210, including filling in the trench 230. First, the patterned OHM layer 310 is removed by an etching process, such as a selective wet etch. The dielectric layer 410 may include silicon oxide, silicon nitride, silicon oxynitride, other suitable materials, or combinations thereof. The dielectric layer 410 may be deposited by CVD, physical vapor deposition (PVD), ALD, thermal oxidation, other suitable techniques, or a combination thereof.

In some embodiment, the FinFET device 200 includes an n-type FinFET (NFET) device, designated with the reference numeral 200A and referred to as the NFET device 200A. The FinFET device 200 also includes a p-type FinFET device, designated with the reference numeral 200B and referred to as the PFET device 200B.

Referring to FIGS. 1 and 7A-7C, the method 100 proceeds to step 112 by covering the NFET 200A with a patterned hard mask (HM) layer 415, forming a third fin structure 440 in the PFET device 200B. The patterned HM layer 415 may include silicon nitride, silicon oxynitride, silicon carbide, or any other suitable dielectric material. The patterned HM layer 415 may be formed similarly to forming of the patterned OHM layer 310 in step 106. In the present embodiment, the patterned HM layer 415 covers the NFET device 200A and leave the PFET device 200B be un-covered.

Figure 7C:
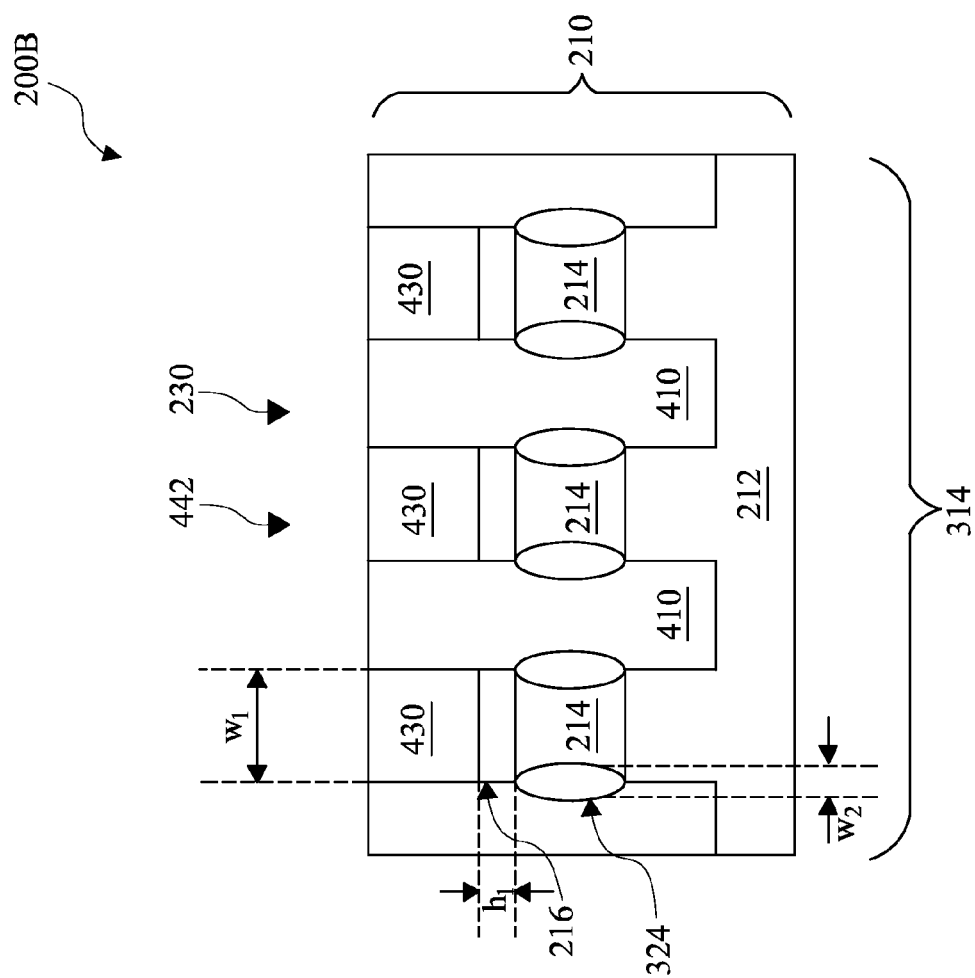
FIG. 7C is a cross-sectional view of an example FinFET device along the line A-A in FIG. 4 at fabrication stages constructed according to the method of FIG. 1.
Figure 8A:
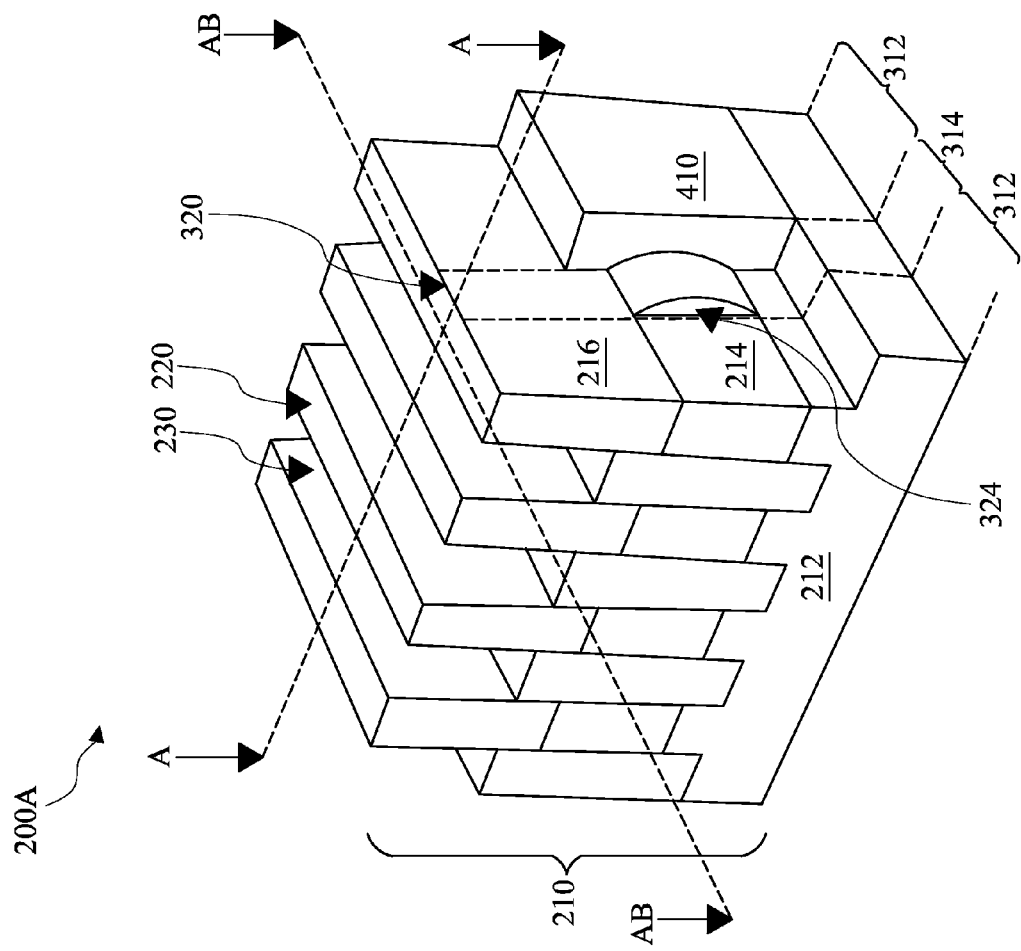
FIGS. 8A-8B are diagrammatic perspective views of an example FinFET device undergoing processes in accordance with some embodiments.
Figure 8B:
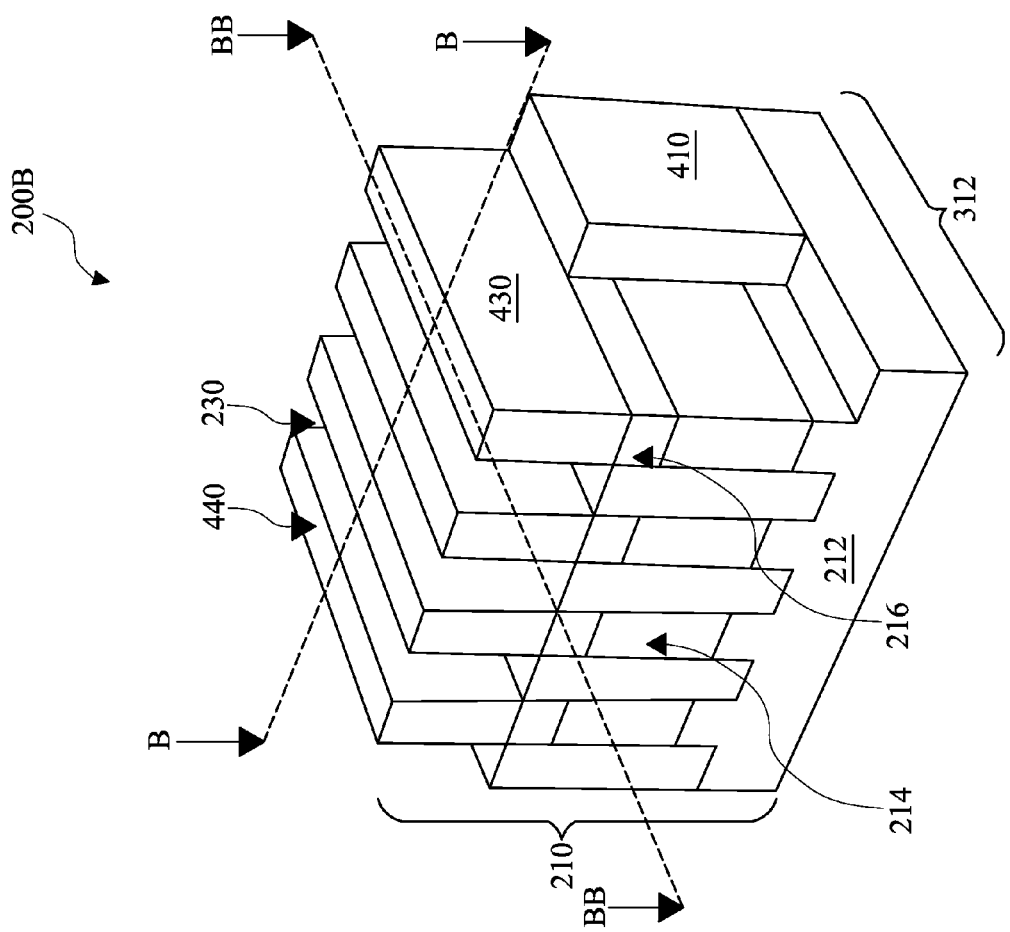

In the PFET device 200B, the third semiconductor material layer 216 in the first fin structure 220 and the second fin structure 320 are recessed by a proper etching process, such as a selective wet etch, a selective dry etch, or a combination thereof. In present embodiment, the recessing process is controlled to leave the remaining third semiconductor material layer 216 have a first height $h_1$. The fourth semiconductor material layer 430 is then deposited over the recessed first fin structure 220 to form a third fin structure 440 (as shown in FIG. 7B) and over the recessed second fin structure 320 to form a fourth fin structure 442 (as shown in FIG. 7C). The fourth semiconductor material layer 430 may be deposited by epitaxial growth. The epitaxial process may include CVD deposition techniques, molecular beam epitaxy, and/or other suitable processes. The fourth semiconductor material layer 430 may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the fourth semiconductor material layer 430 is same as the second semiconductor material layer 214, SiGe. Thus, in the first region 312, the third fin structure 440 is formed to have the fourth semiconductor material layer 430 as its upper portion, the third semiconductor material layer 216 as its upper middle portion, the second semiconductor material layer 214 as its lower middle portion and the first semiconductor material layer 212 as its bottom portion. While in the second region 314, the fourth fin structure 442 is formed to have the fourth semiconductor material layer 430 as its upper portion, the third semiconductor material layer 216 as its upper middle portion, the second semiconductor material layer 214 having the semiconductor oxide feature 324 at its outer layer, as its lower middle portion and the first semiconductor material layer 212 as its bottom portion.

A CMP process may be performed thereafter to remove excessive the fourth semiconductor material layer 430 and planarize the top surface of the PFET device 200B. The HM layer 415 in the NFET device 200A is removed by a proper etching process, such as a wet etch, a dry etch, or a combination thereof.

Referring to FIGS. 1 and 8A-8D, the method 100 proceeds to step 114 by recessing the dielectric layer 410 in both of the NFET device 200A and the PFET device 200B. First, the patterned HM layer 415 is removed from the NFET device 200A by a proper etching process, such as a selective wet etch, or a selective dry etch. The dielectric layer 410 is then recessed in both of the NFET device 200A and the PFET device 200B to expose the upper portion of the first fin structure 220 and the second fin structure 320 (in the NFET device 200A) and the upper portion of the third fin structure 440 and the fourth fin structure 442 (in the PFET device 200B). In the present embodiment, the recessing processes are controlled to have a top surface of the remaining dielectric layer 410 above the second semiconductor material layer 214 with a first distance $d_1$ for gaining process integration flexibility. In the present embodiment, the remaining dielectric layer 410 in the trench 230 forms shallow trench isolation (STI) features.

In some embodiments, the FinFET device 200 includes active device regions 350 and dummy device regions 360. The active device region 350 will have functionality while the dummy device region 360 will not have functionality in the FinFET device 200. In one embodiment, the active device regions 350 are separated by the dummy device region 360. The active device region 350 may include source/drain (S/D) regions and gate regions. In furtherance of the embodiment, one of the S/D regions is a source region, and another of the S/D regions is a drain region. The S/D regions are separated by the gate region.

Figure 9A:
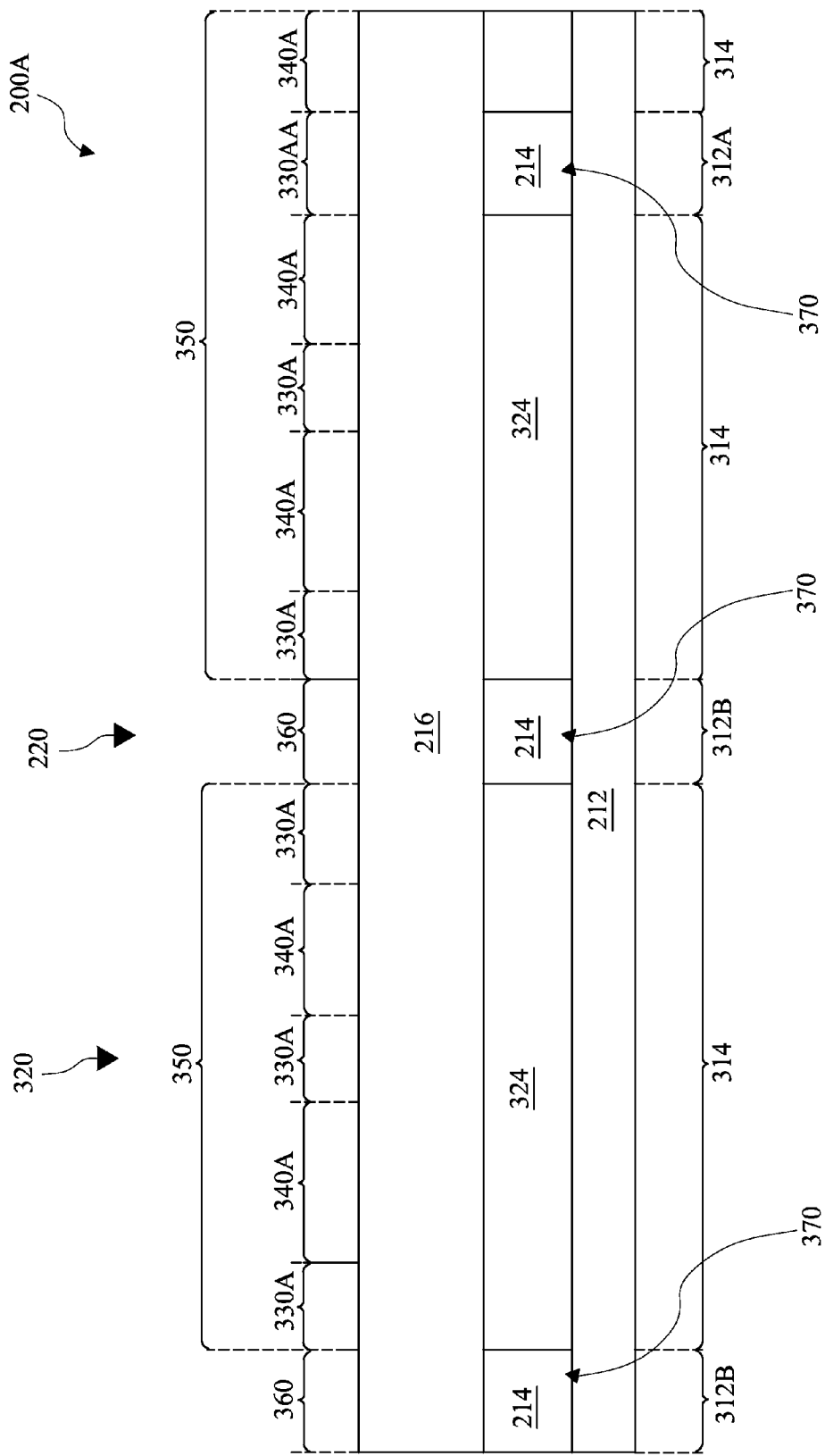
FIG. 9A is a cross-sectional view of an example FinFET device along the line AB-AB in FIG. 8A at fabrication stages constructed according to the method of FIG. 1.

FIG. 9A shows, in the NFET device 200A, the active device region 350 includes first S/D regions 330A and the first gate regions 340A in the second region 314. The second region 314 includes the second fin structures 320. The active device region 350 also includes second S/D regions 330AA in the first region 312. The dummy device region 360 includes another first region 312. The first region 312 includes the first fin 220. For the sake of clarity to better description, the first region 312 located in the active region 350 is referred to as a first subset of the first region 312A and the first region 312 located in the dummy region 360 is referred to as a second subset of the first region 312B.

The active device region 350 may include one or more first gate regions 340A. The two adjacent first gate regions 340A may be separated by the first S/D region 330A or by the second S/D region 330AA. In one embodiment, every third first gate region 340A is separated by the second S/D region 330AA. In another embodiment, every fourth first gate region 340A is separated by the second S/D region 330AA.

In the present embodiment, the second semiconductor material layer 214 in the first region 312 (312A and 312B) is referred to as a first anchor 370. In one embodiment, the first anchors 370 are formed in the dummy device region 360 and the second S/D region 330AA.

Figure 9B:
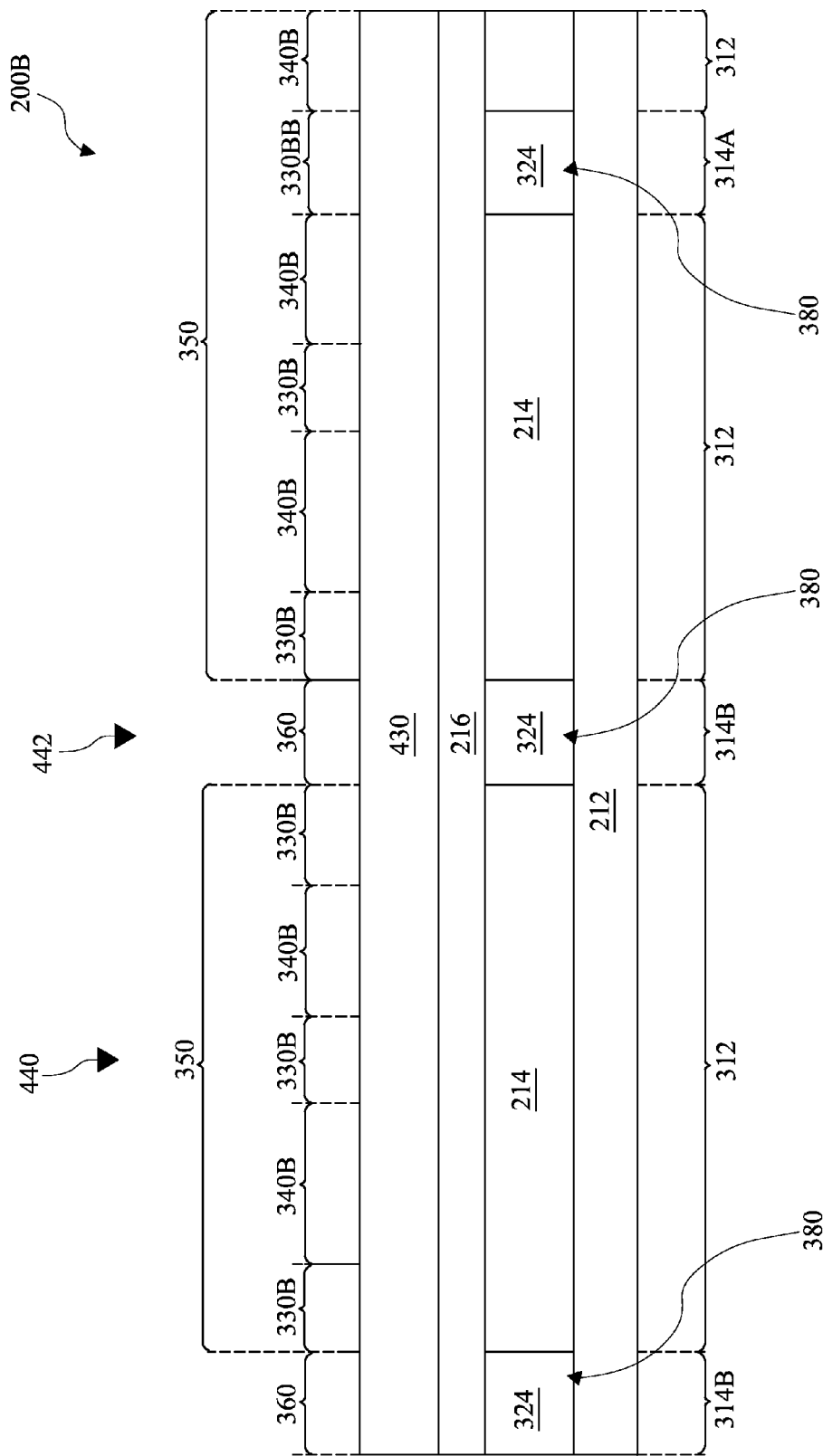
FIG. 9B is a cross-sectional view of an example FinFET device along the line BB-BB in FIG. 8B at fabrication stages constructed according to the method of FIG. 1.
Figure 10A:
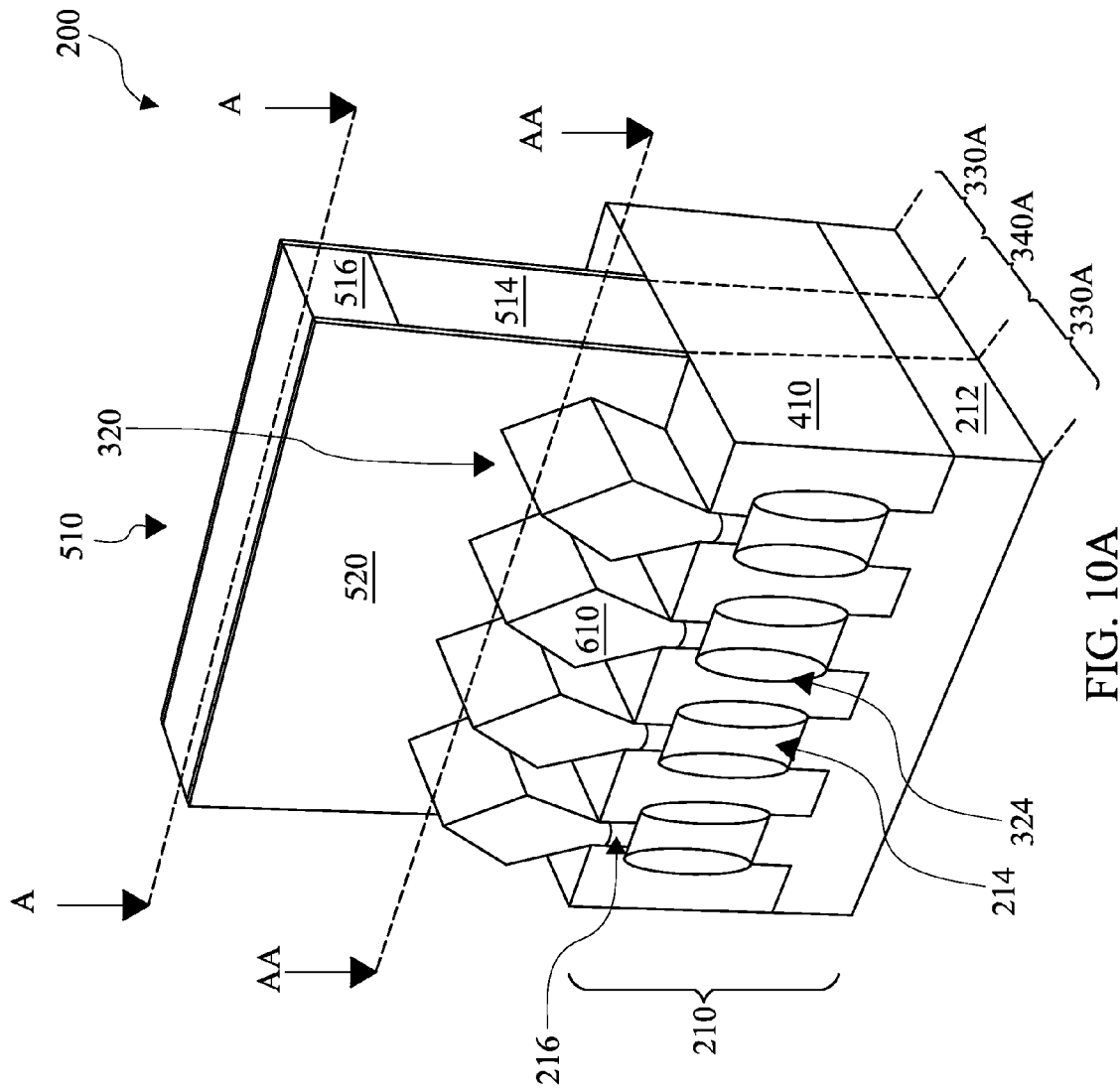
FIG. 10A is a diagrammatic perspective view of an example FinFET device undergoing processes in accordance with some embodiments.
Figure 10D:
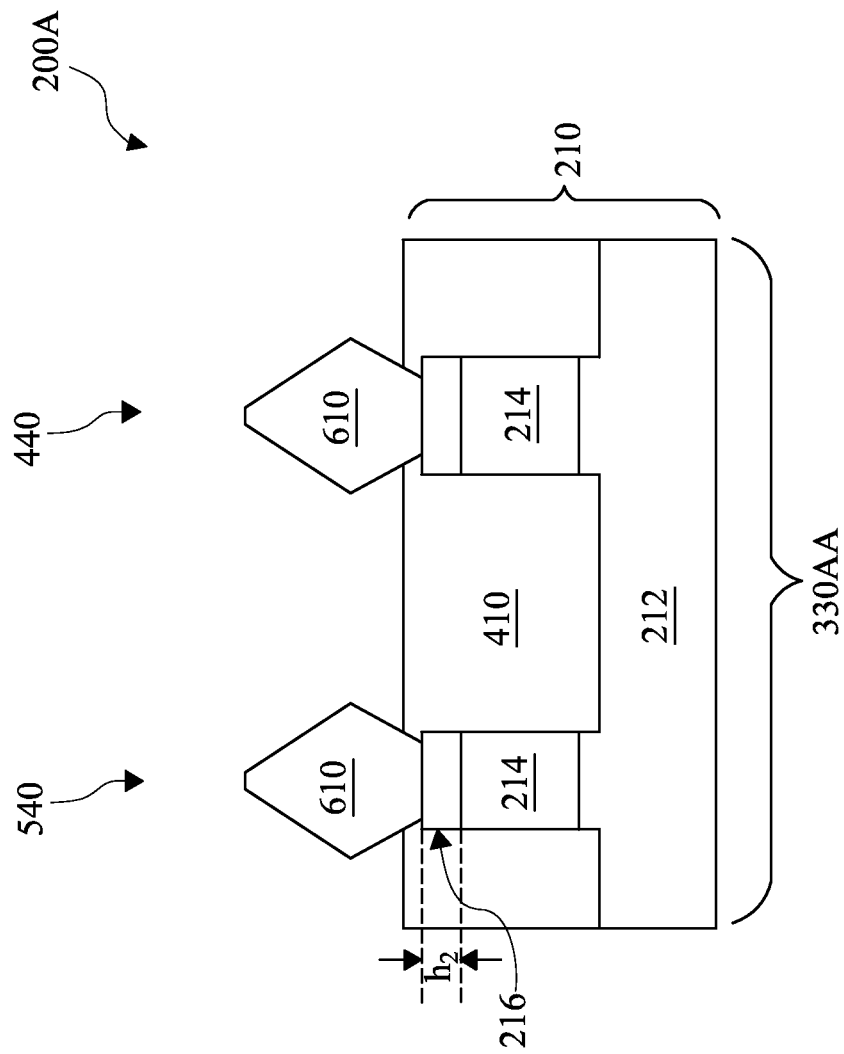
Figure 11C:
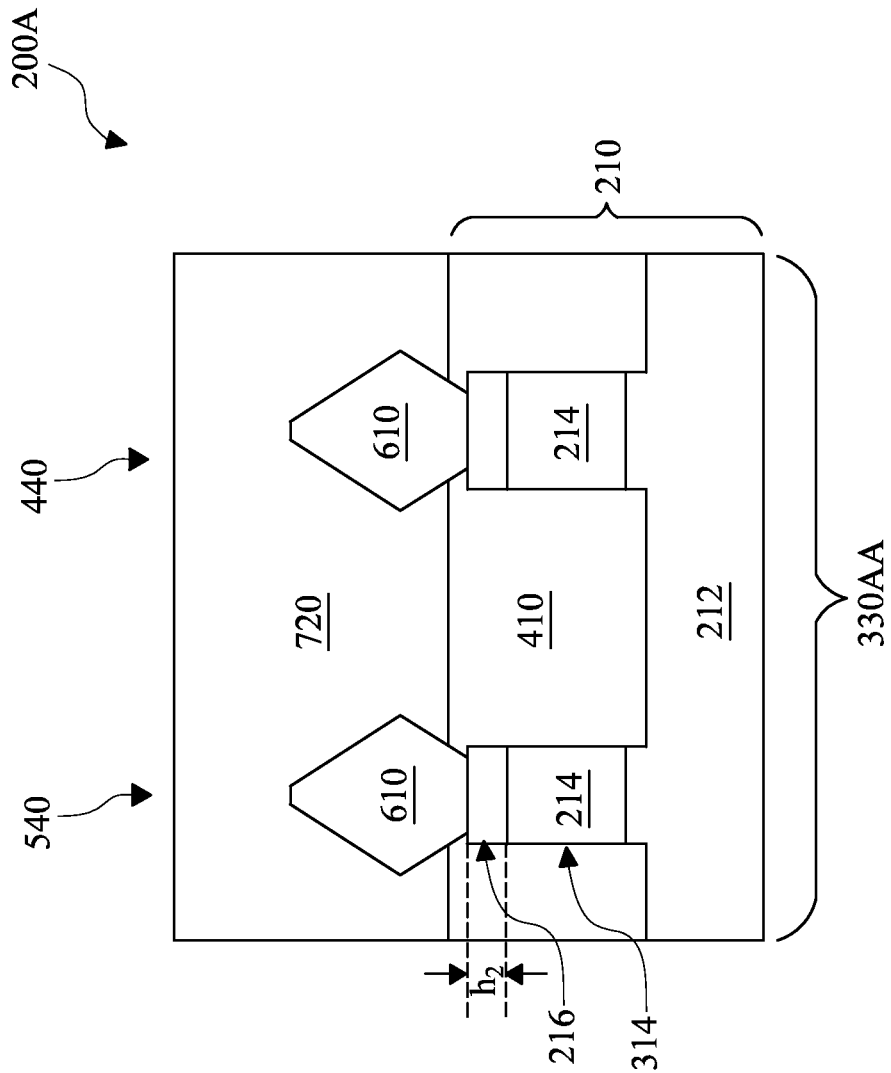
Figure 12A:
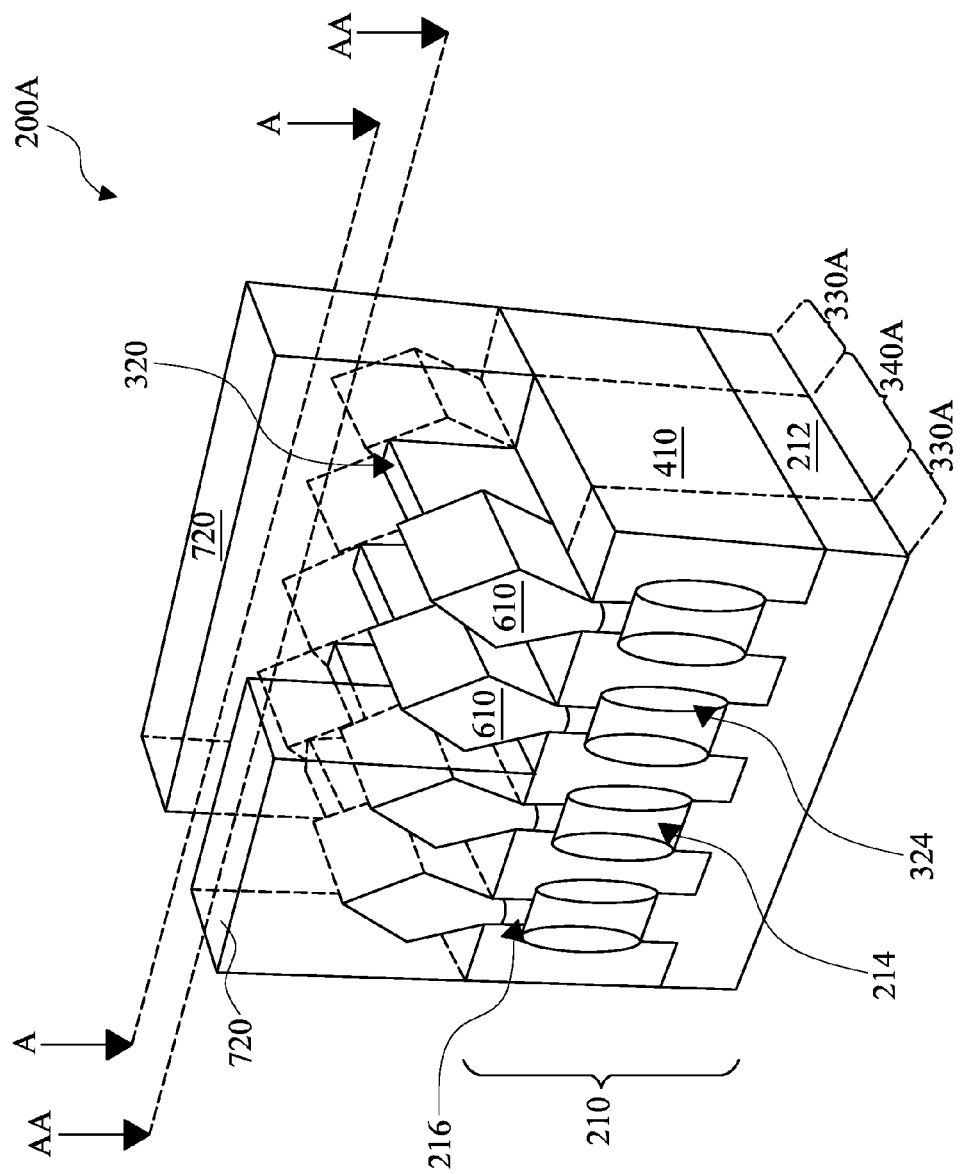
FIG. 12A is a diagrammatic perspective view of an example FinFET device undergoing processes in accordance with some embodiments.

FIG. 9B shows, in the PFET device 200B, the active device region 350 includes third S/D regions 330B and second gate regions 340B in the first region 312. The first region 312 includes the third fin structures 440. The active device region 350 also includes fourth S/D regions 330BB in the second regions 314. The dummy device region 360 includes another second region 314. The second region 314 includes the fourth fin structures 442. For the sake of clarity to better description, the second region 314 included in the active region 350 is referred to as a first subset of the second region 314A and the second region 314 located in the dummy region 360 is referred to as a second subset of the second region 314B.

The active device region 350 may include one or more second gate regions 340B. The two adjacent second gate regions 340B may be separated by the third S/D region 330B or by the fourth S/D region 330BB. In one embodiment, every third second gate region 340B is separated by the fourth S/D region 330BB. In another embodiment, every fourth second gate region 340B is separated by the fourth S/D region 330BB.

In the present embodiment, the second semiconductor material layer 214 in the second regions 314A and 314B are referred to as a second anchor 380. In one embodiment, the second anchors 380 are formed in the dummy device region 360 and the fourth S/D region 330BB. The second anchor 380 is also referred to an oxide anchor and the first anchor 370 is referred to a non-oxide anchor.

The following discussion directed to FIGS. 10A-10D, 11A-11C and 12A-12C use a portion of the NFET device 200A as an example. Those skilled in the art should also recognize that the method 100 would similarly apply to the PFET device 200B.

Referring to FIGS. 1 and 10A-10D, the method 100 proceeds to step 116 by forming a gate stack 510 and sidewall spacers 520 on sidewalls of the gate stack 510, in the first gate regions 340A and the dummy region 360. In one embodiment using a gate-last process, the gate stack 510 is a dummy gate and will be replaced by the final gate stack at a subsequent stage. Particularly, the dummy gate stacks 510 are to be replaced later by a high-k dielectric layer (HK) and metal gate electrode (MG) after high thermal temperature processes, such as thermal annealing for S/D activation during the sources/drains formation. The dummy gate stack 510 is formed on the substrate 210 and is partially disposed over the second fin 320 in the first gate region 340A and the first fin 220 in the dummy device region 360. In one embodiment, the dummy gate stack 510 includes a dielectric layer 512, an electrode layer 514 and a gate hard mask 516. The dummy gate stack 510 is formed by a suitable procedure including deposition and patterning. The patterning process further includes lithography and etching. In various examples, the deposition includes CVD, physical vapor deposition (PVD), ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The dielectric layer 512 includes silicon oxide. Alternatively or additionally, the dielectric layer 512 may include silicon nitride, a high-k dielectric material or other suitable material. The electrode layer 514 may include polycrystalline silicon (polysilicon). The third hard mask 516 includes a suitable dielectric material, such as silicon nitride, silicon oxynitride or silicon carbide. The sidewall spacers 520 may include a dielectric material such as silicon oxide, silicon nitride, silicon carbide, silicon oxynitride, or combinations thereof. The sidewall spacers 520 may include a multiple layers. Typical formation methods for the sidewall spacers 520 include depositing a dielectric material over the gate stack 510 and then anisotropically etching back the dielectric material. The etching back process may include a multiple-step etching to gain etch selectivity, flexibility and desired overetch control.

Referring again to FIGS. 1 and 10A-10D, the method 100 proceeds to step 118 by forming S/D features 610 in the first S/D regions 330A and the second S/D regions 330AA. The S/D features 610 may be formed by recessing a portion of the upper portion of the first fin structures 220 in the first S/D region 330A and a portion of the upper portion of the second fin structures 320 in the second S/D region 330AA. For the sake of clarity to better description, the recessed first fin structures 220 is referred to as a fifth fin structures 530 and the recessed second fin structures 320 is referred to as a sixth fin structures 540. In present embodiment, the recessing process is controlled to leave the remaining third semiconductor material layer 216 have a second height $h_2$. The third semiconductor material layer 216 is recessed to form S/D recessing trenches and epitaxially growing a fourth semiconductor material layer in the sources/drains recessing trenches. The fourth semiconductor material layer includes Ge, Si, GaAs, AlGaAs, SiGe, GaAsP, or other suitable material. The S/D features 610 may be formed by one or more epitaxy or epitaxial (epi) processes. The S/D features 610 may be in-situ doped during the epi process. For example, the epitaxially grown SiGe S/D features 610 may be doped with boron; and the epitaxially grown Si epi S/D features 610 may be doped with carbon to form Si:C S/D features, phosphorous to form Si:P S/D features, or both carbon and phosphorous to form SiCP S/D features. In one embodiment, the S/D features 610 are not in-situ doped, an implantation process (i.e., a junction implant process) is performed to dope the S/D features 610.

Referring to FIGS. 1 and 11A-11C, the method 100 proceeds to step 120 by forming an interlayer dielectric (ILD) layer 720 on the substrate 210 between the gaps of the dummy gate stacks 510. The ILD layer 720 includes silicon oxide, silicon oxynitride, low k dielectric material or other suitable dielectric materials. The ILD layer 720 may include a single layer or alternative multiple layers. The ILD layer 720 is formed by a suitable technique, such as CVD, ALD and spin-on (SOG). A chemical mechanical polishing (CMP) process may be performed thereafter to remove excessive ILD layer 720 and planarize the top surface of the FinFET device 200A.

Referring to FIGS. 1 and 12A-12C, the method 100 proceeds to step 122 by removing the dummy gate stacks 510 in the active device region 350 to form one or more gate trench 810 and remaining the dummy gate stacks 510 in the dummy region 360. The upper portion of the first fin 220 and the isolation features 410 in the gate trench 810 remain. The dummy gate stacks 510 are removed by an etch process (such as selective wet etch or selective dry etch) designed to have an adequate etch selectivity with respect to the third semiconductor material layer 216. The etch process may include one or more etch steps with respective etchants. The gate hard mask layer 516 and the spacers 520 are removed as well. Alternatively, the dummy gate stack 510 may be removed by a series of processes including photolithography patterning and etching process.

Figure 13A:
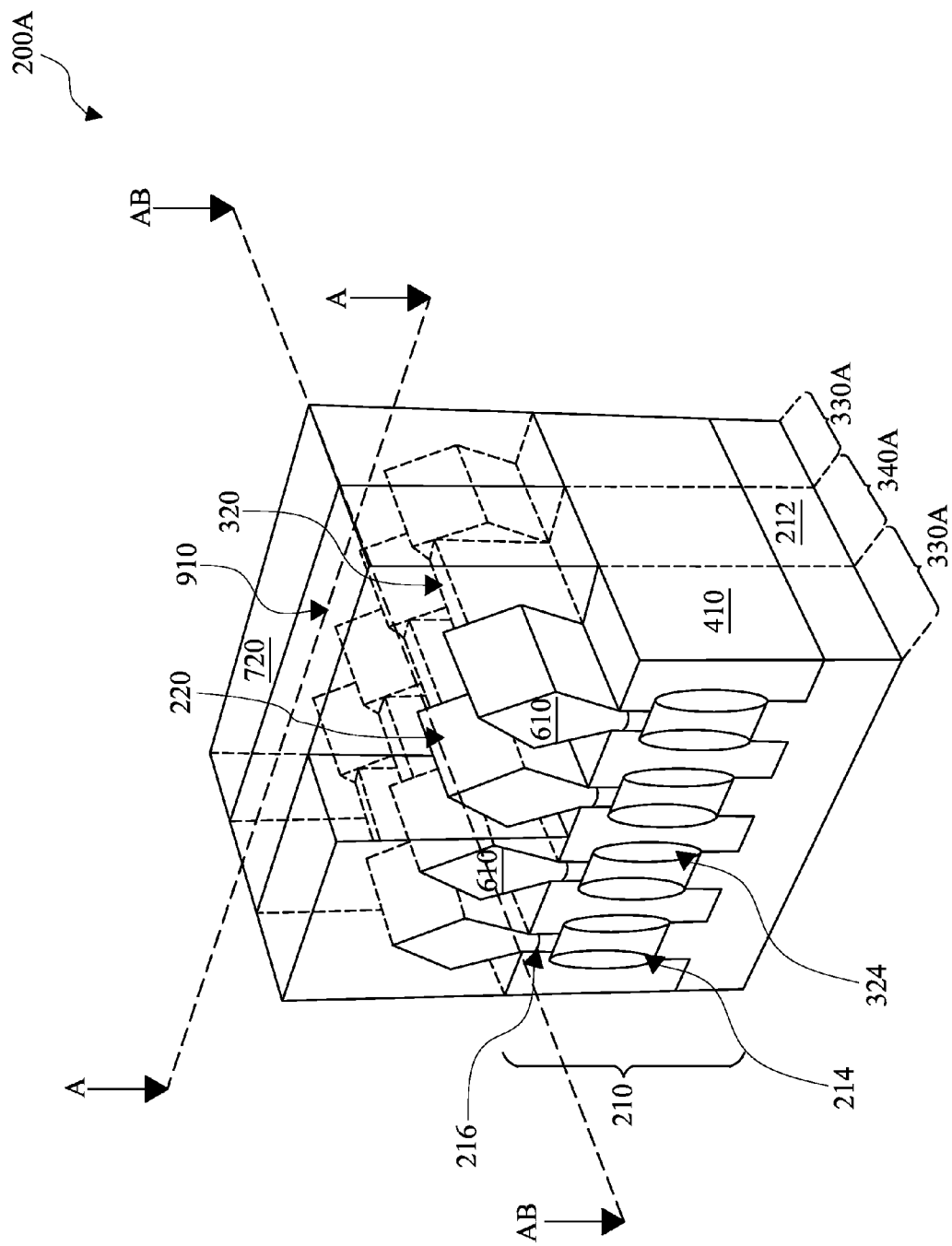
FIGS. 13A-13B are diagrammatic perspective views of an example FinFET device undergoing processes in accordance with some embodiments.
Figure 13B:
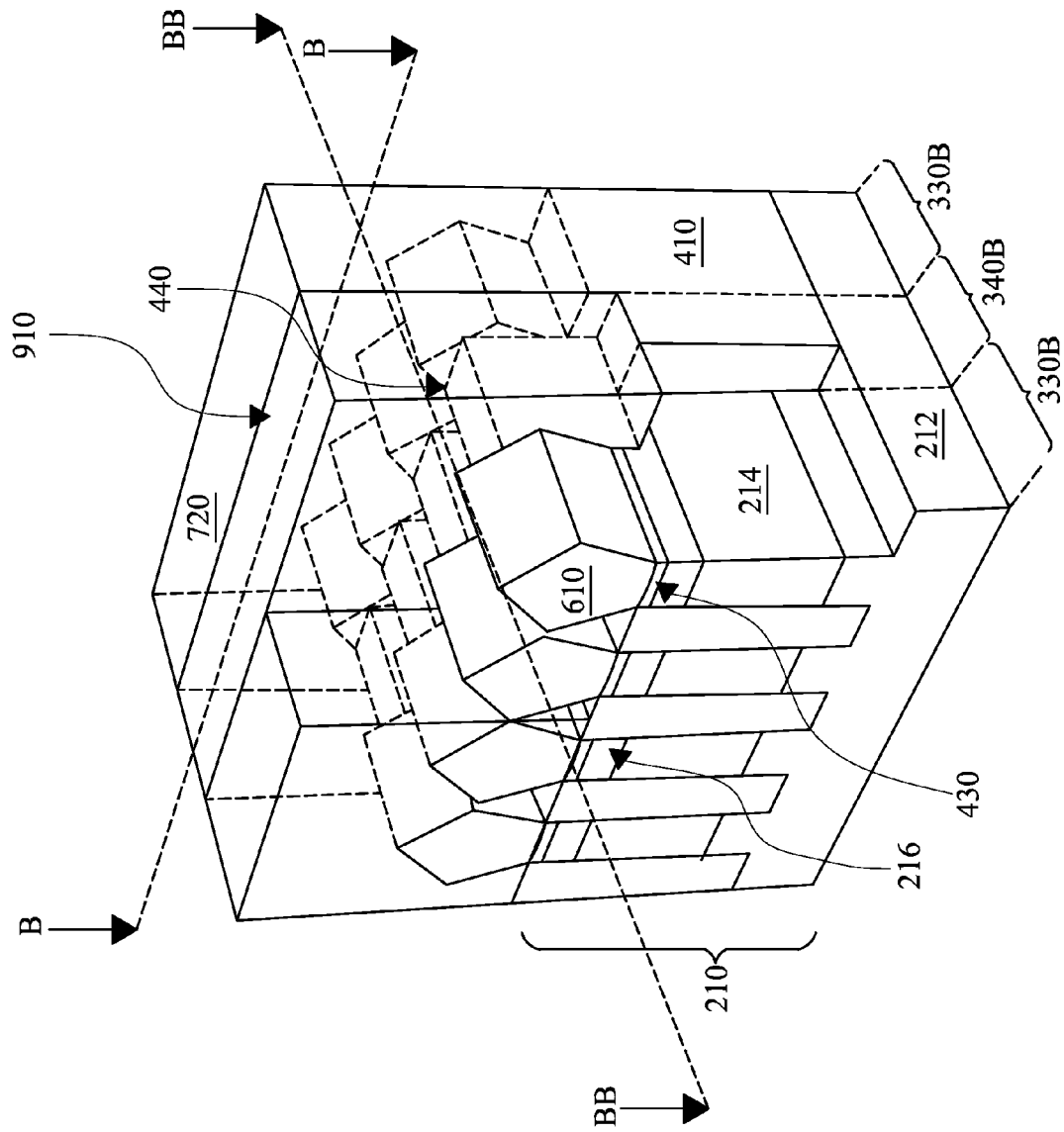

Referring to FIGS. 1 and 13A-3C, the method 100 proceeds to step 124 by forming metal gate stacks (MG) 910 over the substrate 210, including wrapping over a portion of the second fins 320 in the gate trench 810. The metal gate stacks 910 include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the metal gate stacks 910 includes depositions to form various gate materials and a CMP process to remove the excessive gate materials and planarize the top surface of the n-type FET device 200A.

In one embodiment, the gate dielectric layer includes an interfacial layer (IL) deposited by a suitable method, such as atomic layer deposition (ALD), CVD, thermal oxidation or ozone oxidation. The IL includes oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials. The gate dielectric layers wrap over the upper portion of the fins 220 in the gate region 340, where a gate channel will be formed during operating the FinFET device 200.

A metal gate (MG) electrode may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode may be formed by ALD, PVD, CVD, or other suitable process. The MG electrode may be formed separately for the N-FET and P-FFET with different metal layers. A CMP process may be performed to remove excessive MG electrode.

Figure 14A:
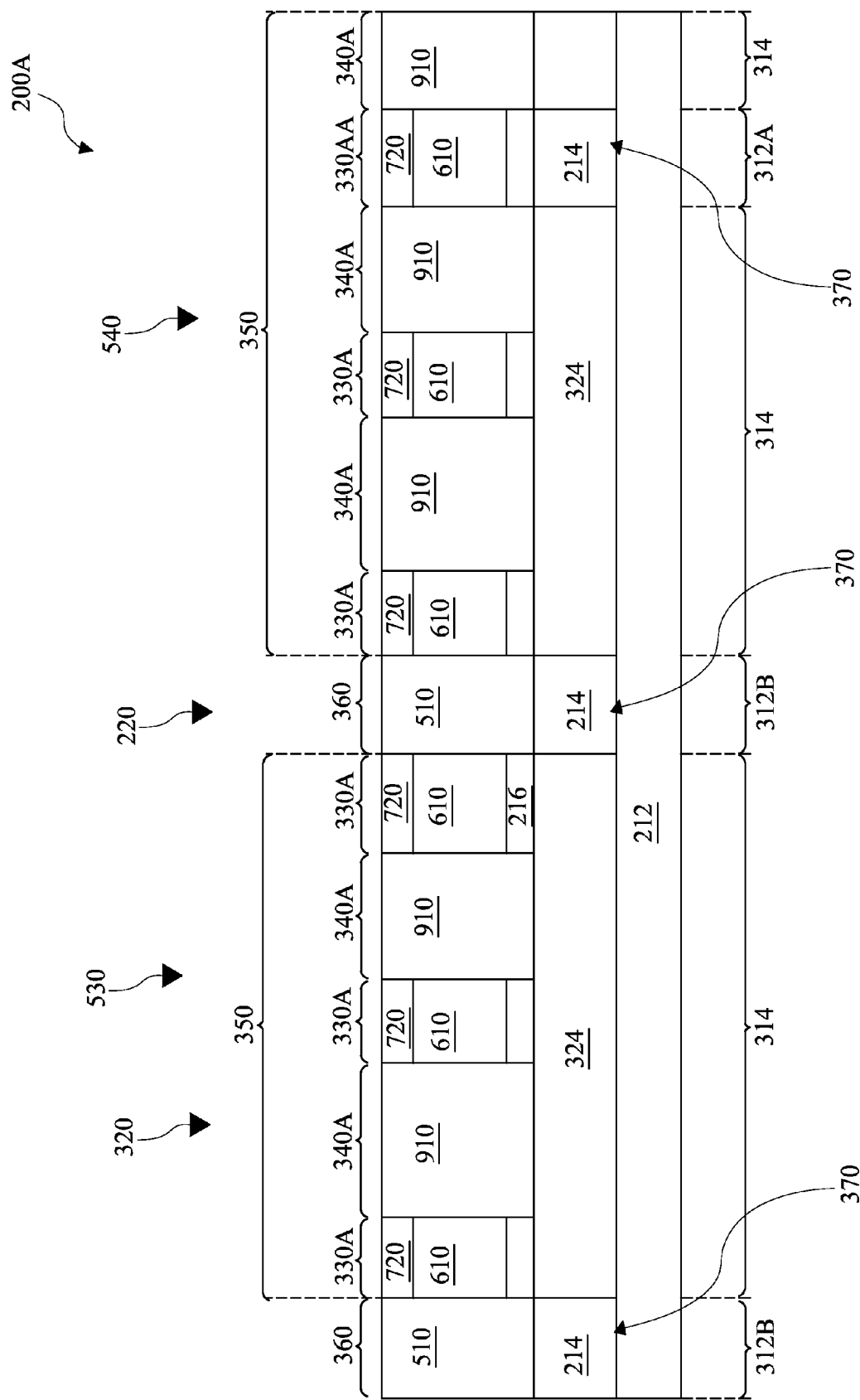
FIG. 14A is a cross-sectional view of an example FinFET device along the line AB-AB in FIG. 13A at fabrication stages constructed according to the method of FIG. 1.

Referring to FIG. 14A, in the NFET device 200A, the active device region 350 includes the first S/D region 330A, separated by the first gate region 340A. The first gate region 340A includes wrapping over the upper portion of the second fin 320. Therefore, during forming the second semiconductor oxide feature 324 in the second fin 320, a proper strain is induced to the first gate region 340A and it will increase mobility in a channel region in the first gate region 340A. In the present embodiment, the active region 350 also includes the second S/D region 330AA, equipped with the non-oxide anchors 370. The second S/D region 330AA locates adjacent the first gate region 340A in a periodical matter, such as every two first gate regions 340A, or every three first gate regions 340A. The active device regions 350 are separated by the dummy region 360, equipped with the non-oxide anchors 370 as well. The non-oxide anchors 370 will enhance strain induced to the first gate region 340A and mobility in the channel region.

Figure 14B:
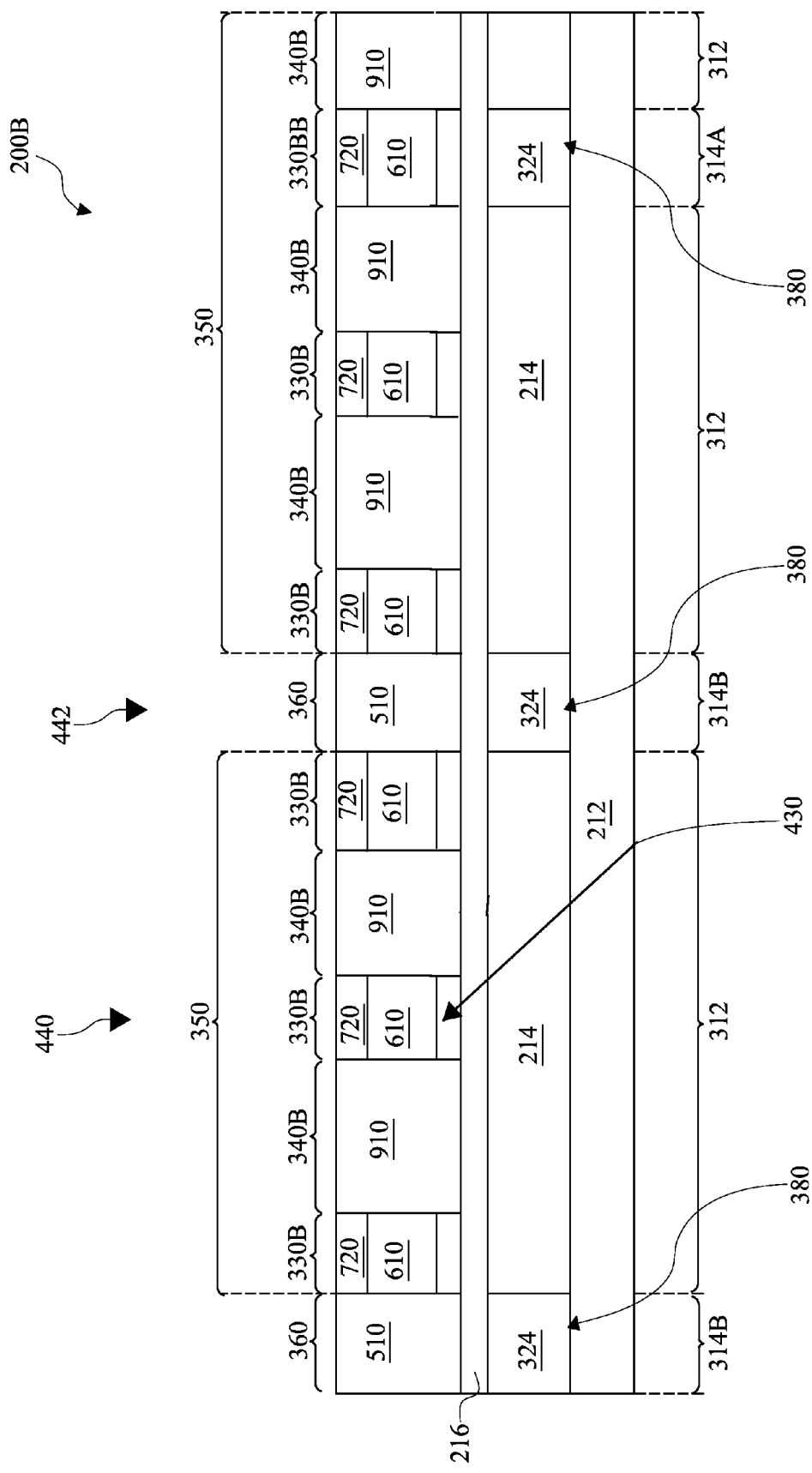
FIG. 14B is a cross-sectional view of an example FinFET device along the line BB-BB in FIG. 13A at fabrication stages constructed according to the method of FIG. 1.

Referring to FIG. 14B, in the p-type FET device 200B, the active device region 350 includes the third S/D region 330B, separated by the second gate region 340B. In the present embodiment, the active device region 350 also includes the fourth S/D region 330BB, which equipped with the oxide anchor 380. The fourth S/D region 330BB locates adjacent the second gate region 340B in a periodical matter, such as every two second gate regions 340B, or every three second gate regions 340B. The active device regions 350 are separated by the dummy region 360, which equipped with the oxide anchors 380 as well. Therefore, during forming the second semiconductor oxide feature 324 in the oxide anchors 380, a proper strain is induced to the second gate region 340B and it will increase mobility in a channel region in the second gate region 340B.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the method 100, and some operations described above may be replaced or eliminated for other embodiments of the method.

Based on the above, the present disclosure offers a FinFET device with a strain gate channel using technique of volume expansion and structure of oxide/or non-oxide anchors induce an efficient strain to the gate region to improve device performance.

Thus, the present disclosure provides one embodiment of fin-like field-effect transistor (FinFET) device. The device includes a substrate having a first region, a second region and a third region. The first region includes a first fin structure having a first semiconductor material layer as its upper portion, a second semiconductor material layer, with a semiconductor oxide feature at its outer layer, as its lower portion. The first region also includes a first high-k (HK)/metal gate (MG) stack over the substrate, including wrapping over an upper portion of the first fin structure and a first source/drain features, separated by the first HK/MG stack, over the recessed first fin structure. The second region includes a second fin structure having the first semiconductor material layer as its upper portion, the second semiconductor material layer as its bottom portion. The second region also includes the first source/drain features over a portion of the second fin structure, which has a recessed upper portion. The third region includes a dummy gate stack over the second fin structure and the two first regions are separated by the second region, or by the third region.

The present disclosure also provides another embodiment of a fin-like field-effect transistor (FinFET) device. The device includes a substrate and a first active device region in the substrate. The first active device region includes a first gate region having a first fin structure. The first fin structure includes a silicon (Si) layer as its upper portion and a silicon germanium (SiGe) layer, with a silicon germanium oxide (SiGeO) feature at its outer layer, as its bottom portion. The active device region also includes a first subset of a first sour/drain (S/D) region, adjacent to the first gate region, a recessed first fin structure in the first subset of the first S/D region, a second subset of the first S/D region, adjacent to the first gate region, a second fin structure in the second subset of the first S/D region. The third fin structure includes the recessed Si layer as its upper portion and the SiGe layer as its bottom portion. The device also includes a first dummy device region between two adjacent first active device regions. The first dummy device region includes a third fin structure having the Si layer as its upper portion and the SiGe layer as its bottom portion.

The present disclosure also includes an embodiment of a method fabricating a fin-like field-effect transistor (FinFET) device. The method includes providing a substrate having a first region and a second region, forming first fin structures over the substrate, forming a patterned oxidation-hard-mask (OHM) layer to expose the first fin in the second region, applying a thermal oxidation process to form an semiconductor oxide feature over the exposed first fin, forming a second fin structures over the substrate, forming a dummy gate stack over the substrate, including wrapping over the first fin structure in a first gate region and over the second fin structure in a second gate region. The method also includes forming source/drain features adjacent to dummy gate stacks and replacing the dummy gate stacks by high-k/metal gate stacks in an active device region in both of the first and the second region and remaining the dummy gate stacks in a dummy devices region, which separates two adjacent active regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-like field-effect transistor (FinFET) device comprising:
    a substrate having two first regions, a second region and a third region;
    wherein each of the first regions includes:
        a first fin structure having a first semiconductor material layer as its upper portion, a second semiconductor material layer, with a semiconductor oxide feature at its outer layer, as its lower portion;
a first high-k (HK)/metal gate (MG) stack over the substrate, including wrapping over an upper portion of the first fin structure; and
first source/drain features, separated by the first HK/MG stack, over the first fin structure;
wherein the second region includes:
a second fin structure having the first semiconductor material layer as its upper portion, the second semiconductor material layer as its bottom portion;
the first source/drain features over a portion of the second fin structure, which has a recessed upper portion; and
wherein the third region includes: a dummy gate stack over the second fin structure; and
wherein the two first regions are separated by the second region, or by the third region.

2. The device of claim 1, further comprising:
two fourth regions in the substrate, each including:
a third fin structure;
a second HK/MG stack over the substrate, including wrapping over an upper portion of the third fin structure; and
the first source/drain features, separated by the second HK/MG stack;
a fifth region in the substrate, including:
a fourth fin structure; and
the source/drain features over the fourth fin structure; and
a sixth region including the dummy gate stack over the fourth fin structure;
wherein the two fourth regions are separated by the fifth region or the sixth region.

3. The device of claim 2, wherein the third fin structure includes:
a third semiconductor material layer as its upper portion;
the first semiconductor material layer as its middle portion; and
the second semiconductor material layer as its bottom portion.

4. The device of claim 2, wherein the fourth fin structure includes:
a third semiconductor material layer as its upper portion;
the first semiconductor material layer as its middle portion; and
the second semiconductor material layer, with the semiconductor oxide feature at its outer layer, as its bottom portion.

5. The device of claim 1, wherein the second semiconductor material includes an epitaxial growth silicon germanium (SiGe).

6. The device of claim 5, wherein the semiconductor oxide feature includes silicon germanium oxide (SiGeO).

7. The device of claim 1, wherein the first semiconductor material includes silicon (Si).

8. The device of claim 1, wherein the first region includes more than one first HK/MG stacks, wherein the second region locates adjacent to every two, or three, or four of the first HK/MG stacks.

9. The device of claim 8, wherein the third region locates adjacent to every two, or three, or four of the first HK/MG stacks.

10. The device of claim 1, wherein the first S/D features include an expitaxially growth semiconductor material.

11. A fin-like field-effect transistor (FinFET), comprising:
a substrate;
a first active device region in the substrate, including:
a first gate region;
a first fin structure in the first gate region, wherein the first fin structure includes:
a silicon (Si) layer as its upper portion; and
a silicon germanium (SiGe) layer, with a silicon germanium oxide (SiGeO) feature at its outer layer, as its bottom portion;
a first subset of a first sour/drain (S/D) region, adjacent to the first gate region;
a recessed first fin structure in the first subset of the first S/D region;
a second subset of the first S/D region, adjacent to the first gate region; and
a second fin structure in the second subset of the first S/D region, wherein the second fin structure includes:
a recessed Si layer as its upper portion; and
the SiGe layer as its bottom portion; and
a first dummy device region between two adjacent first active device regions, wherein the first dummy device region includes:
a third fin structure, having the Si layer as its upper portion and the SiGe layer as its bottom portion.

12. The device of claim 11, further comprising:
a first high-k/metal gate (HKMG) over the substrate, including wrapping over the upper portion of the first fin structure in the first gate region;
first S/D features on top of the upper portion of the recessed first fin structure in the first subset of the first S/D region;
first S/D features on top of the upper portion of the second fin structure in the second subset of the first S/D region; and
a dummy gate stack over the substrate, including wrapping over the upper portion of the third fin structure in the dummy device region.

13. The device of claim 11, wherein the first active device region includes more than one first HK/MG stacks, wherein the second subset of the first S/D region locates adjacent to every two, or three, or four of the first HK/MG stacks.

14. The device of claim 11, further comprising:
a second active device region in the substrate, wherein the second active device region includes:
a fourth fin structure in a second gate region, wherein the fourth fin structure includes:
another SiGe layer as its upper portion;
the recessed Si layer as its middle portion; and
the SiGe layer, with the SiGeO feature at its outer layer, as its bottom portion;
a first subset of a second S/D region, adjacent to the second gate region;
a recessed fourth fin structure in the first subset of the second S/D region;
a second subset of the second S/D region, adjacent to the second gate region;
a fifth fin structure in the second subset of the second S/D region, wherein the fifth fin structure includes:
a recessed SiGe layer as its upper portion;
the recessed Si layer as its middle portion; and
the SiGe layer, with the SiGeO feature at its outer layer, as its bottom portion; and
a second dummy device region between two adjacent second active device regions, wherein the second dummy device region includes:
a sixth fin structure, having the SiGe layer as its upper portion, the recessed Si layer as its middle portion and the SiGe layer, with the SiGeO feature at its outer layer, as its bottom portion.

15. The device of claim 14, further comprising:
a second high-k/metal gate (HKMG) over the substrate, including wrapping over the upper portion of the fourth fin structure in the second gate region;
second S/D features on top of the upper portion of the recessed fourth fin structure in the first subset of the second S/D region;
second S/D features on top of the upper portion of the fifth fin structure in the second subset of the second S/D region; and
the dummy gate stack over the substrate, including wrapping over the upper portion of the third fin structure in the dummy device region.

16. The device of claim 15, wherein the second active device region includes more than one second HK/MG stacks, wherein the second subset of the second S/D region locates adjacent to every two, or three, or four of the second HK/MG stacks.

17. A fin-like field-effect transistor (FinFET) device, comprising:
a substrate;
a first fin structure over the substrate, wherein the first fin structure includes a first semiconductor material layer as its upper portion and a second semiconductor material layer as its lower portion, and wherein the lower portion of the first fin structure includes an oxidation of the second semiconductor material at its outer layer;
a second fin structure over the substrate, wherein the second fin structure includes the first semiconductor material layer as its upper portion and the second semiconductor material layer as its bottom portion, and wherein the bottom portion of the second fin structure does not include the oxidation of the second semiconductor material at its outer layer;
a first gate stack over the substrate and wrapping over a portion of the first fin structure; and
first source/drain features over the first fin structure and separated by the first gate stack.

18. The device of claim 17, further comprising:
a third fin structure over the substrate, wherein the third fin structure includes a third semiconductor material layer as its upper portion, a recessed first semiconductor material layer as its middle portion, and the second semiconductor material layer as its lower portion, and wherein the lower portion of the third fin structure does not include the oxidation of the second semiconductor material at its outer layer;
a fourth fin structure over the substrate, wherein the fourth fin structure includes the third semiconductor material layer as its upper portion, the recessed first semiconductor material layer as its middle portion, and the second semiconductor material layer as its lower portion, and wherein the lower portion of the fourth fin structure includes the oxidation of the second semiconductor material at its outer layer;
a second gate stack over the substrate and wrapping over a portion of the third fin structure; and
second source/drain features over the third fin structure and separated by the second gate stack.

19. The device of claim 18, wherein the first fin structure, the first gate stack, and the first source/drain features form an n-type FinFET, and wherein the third fin structure, the second gate stack, and the second source/drain features form a p-type FinFET.

20. The device of claim 18, wherein the first semiconductor material includes Si, and the second and third semiconductor materials each includes SiGe.

* * * * *